(12) United States Patent
Goida et al.

(10) Patent No.: US 9,343,367 B2
(45) Date of Patent: May 17, 2016

(54) INTEGRATED DEVICE DIE AND PACKAGE WITH STRESS REDUCTION FEATURES

(71) Applicant: ANALOG DEVICES, INC., Norwood, MA (US)

(72) Inventors: Thomas M. Goida, Windham, NH (US); Xiaojie Xue, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/577,128

(22) Filed: Dec. 19, 2014

(65) Prior Publication Data

US 2015/0181697 A1  Jun. 25, 2015

Related U.S. Application Data

(60) Provisional application No. 61/919,357, filed on Dec. 20, 2013.

(51) Int. Cl.
*H01L 21/78* (2006.01)
*H01L 29/06* (2006.01)
*H01L 23/31* (2006.01)

(52) U.S. Cl.
CPC ............ *H01L 21/78* (2013.01); *H01L 29/0657* (2013.01); *H01L 23/3121* (2013.01); *H01L 2224/48091* (2013.01); *H01L 2924/10158* (2013.01)

(58) Field of Classification Search
USPC .......................................................... 257/666
See application file for complete search history.

(56) References Cited

U.S. PATENT DOCUMENTS

| | | | |
|---|---|---|---|
| 5,627,407 A | 5/1997 | Suhir et al. | |
| 6,184,064 B1 | 2/2001 | Jiang et al. | |
| 6,689,640 B1 * | 2/2004 | Mostafazadeh | 438/121 |
| 7,022,546 B2 | 4/2006 | Spooner et al. | |
| 7,227,245 B1 * | 6/2007 | Bayan et al. | 257/666 |
| 7,586,178 B2 * | 9/2009 | Manatad | 257/666 |
| 7,615,853 B2 * | 11/2009 | Shen et al. | 257/676 |

(Continued)

FOREIGN PATENT DOCUMENTS

| | | |
|---|---|---|
| JP | H02-78234 | 3/1990 |
| JP | H07-302772 | 11/1995 |

(Continued)

OTHER PUBLICATIONS

Extended European Search Report mailed Dec. 11, 2015 issued in EP Application No. 14199059.8, in 10 pages.

*Primary Examiner* — Thao P Le
(74) *Attorney, Agent, or Firm* — Knobbe, Martens, Olson & Bear LLP

(57) ABSTRACT

An integrated device die and package is disclosed. The integrated device die includes a unitary body. The unitary body can have an upper portion comprising one or more active components. The upper portion can have first and second opposing lateral sides defining at least a portion of a periphery of the upper portion such that an upper surface of the upper portion is disposed between upper edges of the first and second opposing lateral sides. The unitary body can also have a lower portion monolithically formed with the upper portion. The lower portion can comprise a pedestal extending downwardly from the upper portion. The pedestal can be laterally inset from lower edges of the first and second opposing lateral sides. The pedestal can include a distal end portion configured to couple to a carrier.

20 Claims, 16 Drawing Sheets

(56) References Cited

U.S. PATENT DOCUMENTS

| | | |
|---|---|---|
| 7,795,725 B2 | 9/2010 | Mouli et al. |
| 7,939,916 B2 | 5/2011 | O'Donnell et al. |
| 8,344,487 B2 | 1/2013 | Zhang et al. |
| 8,569,861 B2 | 10/2013 | O'Donnell et al. |
| 2002/0125550 A1* | 9/2002 | Estacio ............... 257/666 |
| 2003/0025183 A1 | 2/2003 | Thornton et al. |
| 2005/0093174 A1 | 5/2005 | Seng |
| 2007/0205792 A1 | 9/2007 | Mouli et al. |
| 2014/0103501 A1* | 4/2014 | Chen et al. ............... 257/666 |

FOREIGN PATENT DOCUMENTS

| | | |
|---|---|---|
| JP | 2002-134439 | 5/2002 |
| WO | WO 2008/091840 A2 | 7/2008 |
| WO | WO 2010/039855 A2 | 4/2010 |

\* cited by examiner

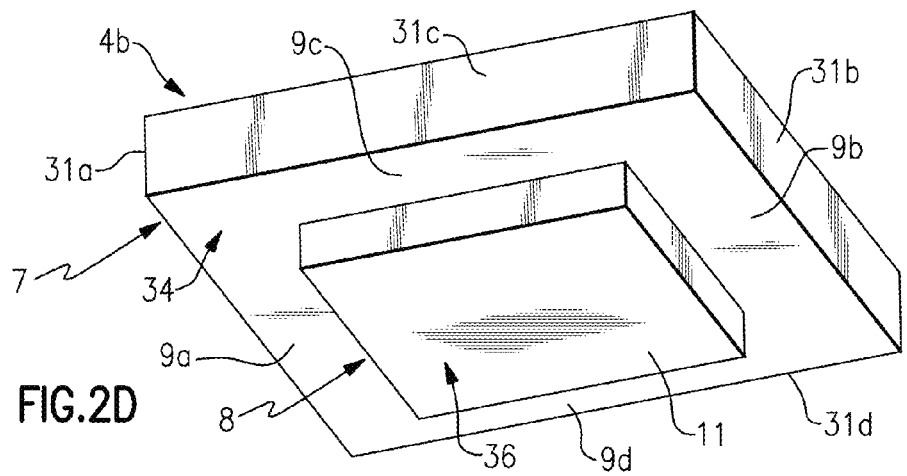
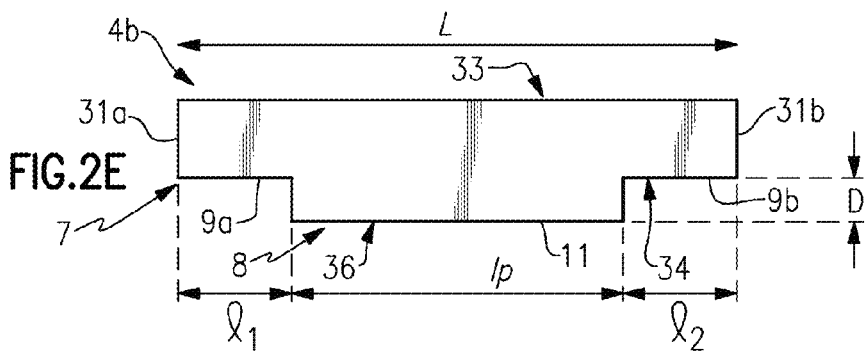
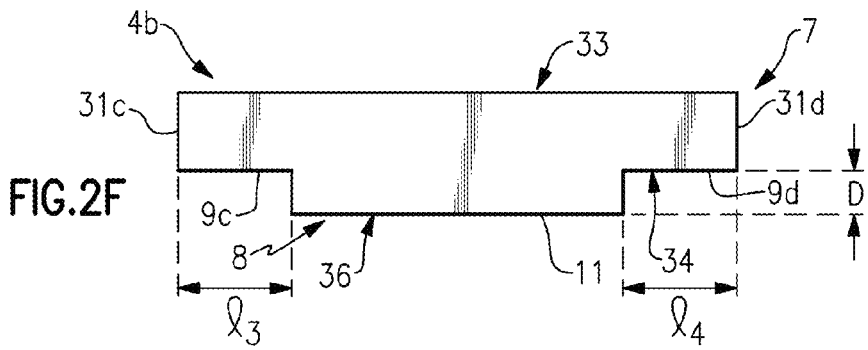
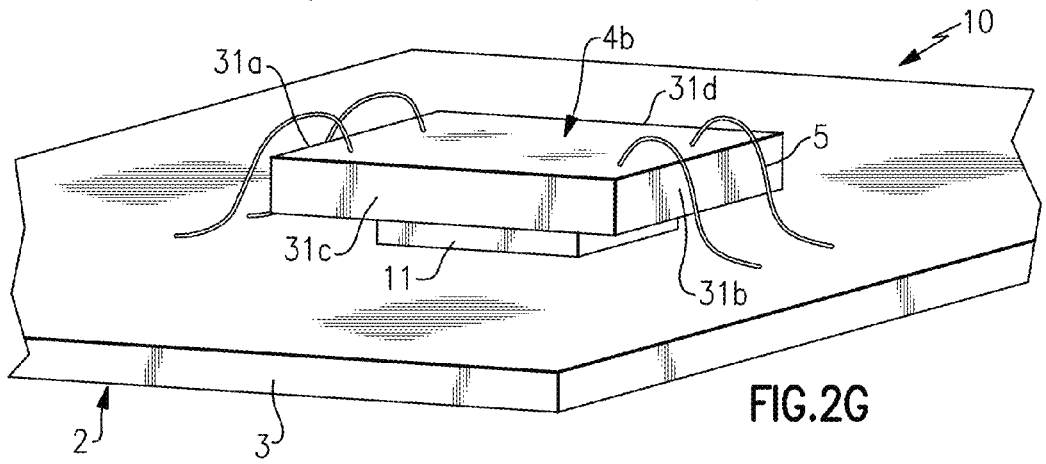

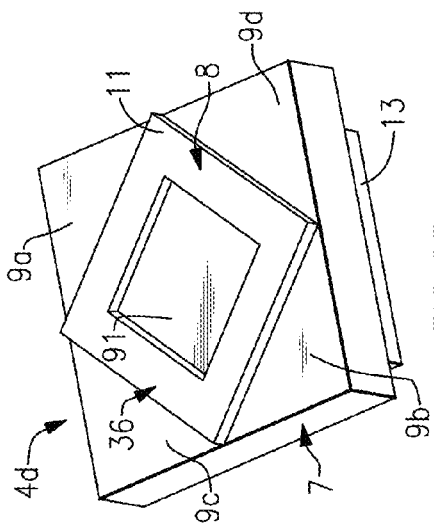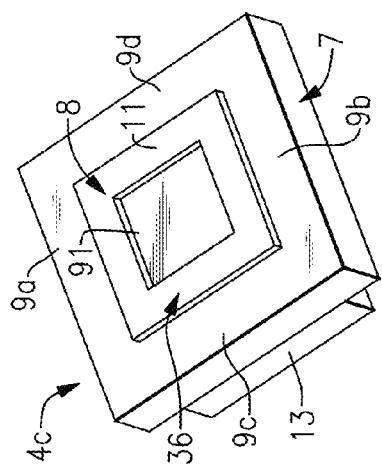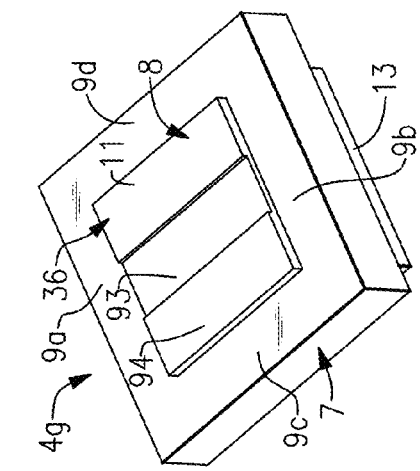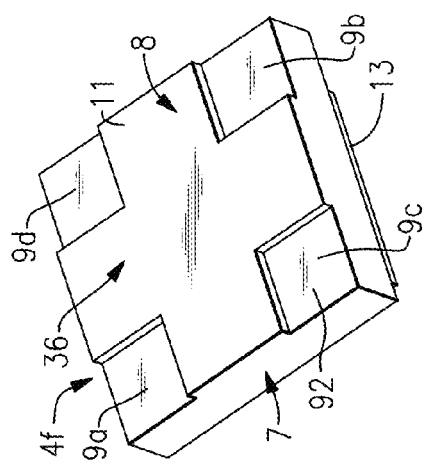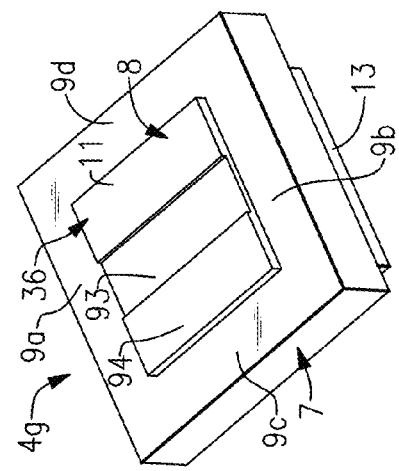

INTEGRATED DEVICE DIE AND PACKAGE WITH STRESS REDUCTION FEATURES

CROSS-REFERENCE TO RELATED APPLICATIONS

This application claims priority to U.S. Provisional Patent Application No. 61/919,357, filed Dec. 20, 2013, the contents of which are incorporated by reference herein in their entirety and for all purposes.

BACKGROUND

1. Field of the Invention

The field relates generally to integrated device dies and packages, and, more particularly, to integrated device dies having stress reduction features.

2. Description of the Related Art

Integrated device dies are typically coupled to a package substrate or to another device die to electrically communicate with a larger electronic device or system. Packaging has been developed to protect integrated device dies and to facilitate connection into larger systems. However, in some situations, the packaging process, or the use of the package by an assembler or end user of the larger system, may subject the device die to stresses. For example, in some arrangements, the manufacturer, assembler, and/or end user may subject the die to bending, torsional, tension, compression, and/or other stresses that can damage various components of the die or alter electrical performance. Accordingly, there remains a continuing need for reducing stresses in integrated device dies.

SUMMARY

In one embodiment, an integrated device package is disclosed. The integrated device package can include a carrier and an integrated device die mounted to the carrier. The integrated device die can comprise a unitary body comprising a pedestal and first and second overhang regions. The first and second overhang regions can be monolithically formed with a proximal end portion of the pedestal. The first overhang region and the second overhang region can be disposed on opposing sides of the pedestal such that the pedestal is laterally inset from lateral edges of each of the first and second overhang regions. The pedestal can comprise a distal portion attached to the carrier.

In another embodiment, a method of forming a microelectronic device comprising an integrated device die having a unitary body is disclosed. The method can include forming the unitary body. Forming the unitary body can comprise providing an upper portion comprising active components. The upper portion can have first and second opposing lateral sides defining at least a portion of a periphery of the upper portion such that an upper surface of the upper portion is disposed between upper edges of the first and second opposing lateral sides. Forming the unitary body can also comprise providing a lower portion monolithically formed with the upper portion. The lower portion can comprise a pedestal extending from the upper portion. The pedestal can be laterally inset from lower edges of the first and second opposing lateral sides. The pedestal can include a distal end portion arranged to couple to a carrier. The method can also include attaching the distal portion of the pedestal to the carrier to mount the integrated device die to the carrier.

In another embodiment, a microelectromechanical systems (MEMS) device die is disclosed. The MEMS device die can include a unitary body. The unitary body can comprise an upper portion comprising one or more MEMS devices. The upper portion can have first and second opposing lateral sides defining at least a portion of a periphery of the upper portion such that the upper portion has a length between upper edges of the first and second opposing lateral sides. A lower portion can be monolithically formed with the upper portion. The lower portion can comprise a pedestal extending downwardly from the upper portion. The pedestal can be laterally inset from lower edges of the first and second opposing lateral sides. The pedestal can include a distal end portion configured to couple attach to a carrier.

In yet another embodiment, a method of forming a microelectronic device comprising an integrated device die having a unitary body is disclosed. The method can comprise forming active components in a front side of a wafer. The method can comprise cutting along a back side of a wafer and partially through a thickness of the wafer between adjacent device cells to define a pedestal, the cutting defining a groove in the back side of the wafer between adjacent device cells.

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIG. 2D is a schematic three-dimensional perspective view of an integrated device die, according to another embodiment.

FIGS. 2E and 2F are schematic orthogonal cross-sectional side views of the integrated device die of FIG. 2D.

FIG. 2G is a schematic three-dimensional perspective view of a partially-fabricated integrated device package that includes the integrated device die of FIGS. 2D-2F, according to one embodiment.

FIGS. 8A-8F are bottom perspective views of device dies that have pedestals with different side profiles.

DETAILED DESCRIPTION

Figure 1:
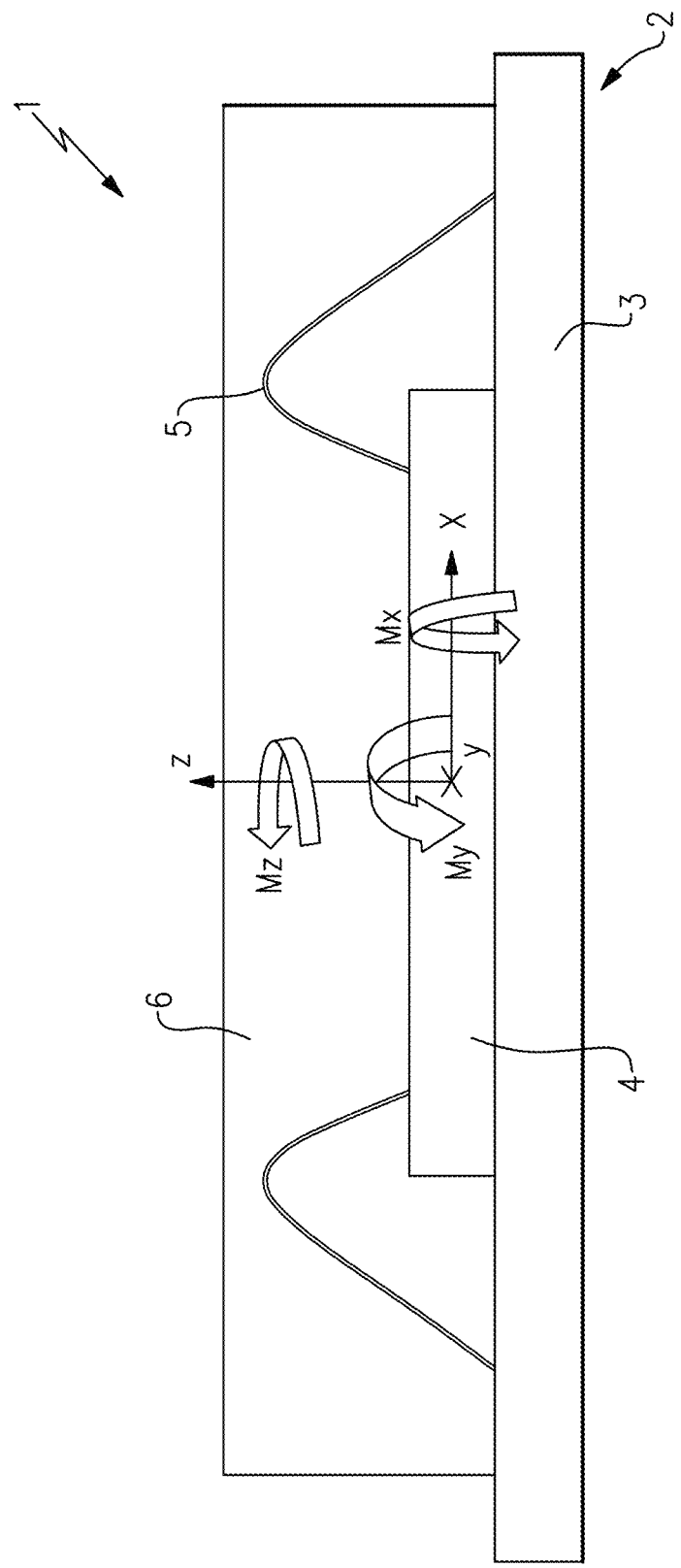
FIG. 1 is a schematic side cross-sectional view of an integrated device package.

Various embodiments disclosed herein relate to integrated device dies and packages having stress reduction features. An integrated device die may be mounted on a carrier to electrically communicate with a larger electronic device or system. The integrated device dies disclosed herein can include any suitable type of device die, such as an integrated circuit die (e.g., an application specific integrated circuit, or ASIC), a microelectromechanical systems (MEMS) die, etc. The integrated device die and carrier may be packaged in a package body using various packaging techniques. The packaged integrated device can be mounted to a system board for integration into a larger electronic device or system.

In some arrangements, the carrier comprises a package substrate, such as a leadframe, a ceramic substrate, a printed circuit board (PCB), or other suitable substrate. In such arrangements, the package substrate may be mounted to a system board to integrate the die within the larger system, such as an electronic device. In other arrangements, the carrier comprises another integrated device die. In these arrangements, the integrated device die can be stacked on a second integrated device die, and the second integrated device die can be mounted to a package substrate such as a leadframe or PCB. For example, the integrated device die can comprise a microelectromechanical systems (MEMS) die, and the second integrated device die can comprise an ASIC, particularly a processor, in electrical communication with the MEMS die.

The integrated device die may be subject to stresses imparted on the die by components of the package, by the larger electronic system, by packaging processes or use of the final product. For example, the package body may exert bending, torsional, tension, compression, or other loads on the die. In arrangements where the package body comprises a molding material or encapsulant applied over the die, the molding material or encapsulant may induce stresses against the top surface of the die, which can result in bending and/or torsional loads on the die. For example, particles in the die and/or expansion of the molding material during processing or use (such as temperature or humidity changes) may apply vertical and/or horizontal forces against the die. Furthermore, the die attach interface between the die and the carrier may introduce stresses on the die. For example, attaching the die to the carrier can induce bending or torsional loads due to forces applied when attaching the die, when soldering leads and/or when wirebonding. Stresses may also be applied to the die when adhered components have differing coefficients of thermal expansion (CTE). When the package is heated or cooled, either in use or during the packaging process, the CTE mismatch between adhered components may induce stresses in the die. Other types of external forces may also introduce stresses into the package and die, e.g., if the larger electronic device is subjected to vibration or jarring, dropped, impacted against another object, subject to operational loads during use, etc. The induced stresses can negatively affect the performance of the die. For example, in sensor dies, the stresses can disadvantageously affect the sensor readings, reducing the accuracy of the die. Electrical performance of devices in processors and other ASICs can also be negatively impacted by such stresses.

The stresses induced in the die may be generated throughout the lifetime of the die and package. For example, stresses may be introduced during manufacturing, such as when the die is mounted to the carrier and packaged in the package body. Stresses may be introduced during device assembly. For example, bending, torsional, or other stresses may be induced when the assembler mounts the package on a larger system board and/or into the larger system itself, and heat from soldering operations can induce stresses from differential thermal expansion among the die, packaging substrate, encapsulant and adhesive layers. Stresses may also be generated in the die and package during use or operation by the end user. For example, the die may be subject to recurring loads during operation of the device. In the case of a MEMS accelerometer or motion sensor, for example, the MEMS die and associated processor die may be subject to recurring forces due to movement of the larger system (e.g., an automobile). In mobile devices, such as mobile smartphones or tablets, the package and die may be subject to loads when the user drops the device and/or when the device is subject to temperature fluctuations.

Accordingly, various embodiments disclosed herein provide an integrated device die that includes stress reducing features arranged to reduce the magnitude of stresses or strains that are induced when the die is subject to external forces. In some embodiments an integrated device die is shaped to define a cross-sectional profile that is more resistant to the external loading conditions. For example, the die can be shaped to have a T-shaped cross-section in some embodiments. In some embodiments, the T-shaped profile may be defined in one side cross-section. In other embodiments, the T-shaped profile may be defined in two orthogonal side cross-sections. The T-shaped cross-section can be shaped to better resist bending and/or torsional loads applied to the die. As explained herein, other cross-sections of the die may be suitable for accommodating external loading conditions. Without being limited by theory, the dies disclosed herein may be shaped to achieve a desired second moment of area (or the area moment of inertia) that is sufficiently resistant to bending and/or torque loading conditions. Accordingly, as compared to planar devices dies, or device dies having a rectangular cross-section, the device dies disclosed herein can be configured to reduce the stresses and/or strains that are induced in the dies by external loads.

Furthermore, in the embodiments disclosed herein, the shaped device dies can comprise a single, monolithically-formed or unitary body. The monolithic or unitary bodies disclosed herein can advantageously reduce stresses and strains generated in the die as compared to arrangements in which multiple components are coupled together to reduce stresses. For example, the use of multiple components coupled together may introduce stresses at the interface between the components. Thermally-induced or other stresses may propagate from the interface through the die. Accordingly, the unitary body die structures disclosed herein may provide additional advantages when compared with multi-piece arrangements.

For example, in some embodiments, the integrated device die comprises a unitary body having an upper portion and a lower portion. The upper portion can comprise one or more active components and can have first and second opposing lateral sides defining at least a portion of a periphery of the upper portion such that an upper surface of the upper portion is disposed between upper edges of the first and second opposing lateral sides. The lower portion can be monolithically formed with the upper portion. The lower portion can comprise a pedestal extending downwardly from the upper portion. The pedestal can be laterally inset from lower edges of the first and second opposing lateral sides. In some arrangements, a lower surface of the upper portion defines overhang regions extending from the pedestal to the lower edges of the first and second opposing lateral sides. The pedestal can also include a distal end portion configured to couple to the carrier. Advantageously, the area of the distal end portion of the pedestal that attaches to the carrier may be relatively small. Using a small attachment area for the distal portion can beneficially reduce stresses that are transmitted to the die.

Additional advantages of the embodiments disclosed herein can be realized by enabling simplified manufacturing processes. For example, the integrated device dies disclosed herein can be formed at the wafer level in some arrangements by simple partial cut operations. For example, the pedestal can be formed in the die by sawing along a back side of the wafer and partially through a thickness of the wafer between adjacent device cells. The sawing can define a groove in the bottom surface of the wafer between the adjacent cells. The wafer can be diced into a plurality of integrated device dies by sawing completely through the thickness of the wafer between adjacent device cells. The sawing operation used to dice the wafer can be performed along narrower saw streets than the sawing operation used to define the pedestal. For example, during dicing, the saw streets can be defined within the grooves defined by the pedestal-forming saw operation. One set of parallel grooves can define a T-shaped cross-section for the later singulated dies; additional parallel grooves that cross with the first set (e.g., perpendicular to the first set) can define another T-shaped cross-section in, e.g., an orthogonal direction. Accordingly, in some embodiments, the stress reduction features can be defined in the die using conventional processing techniques, and can be performed in an efficient manner, e.g., by relatively straightforward sawing operations. In other embodiments, the grooves can be formed by other techniques, such as etching or laser cutting.

FIG. 1 is a schematic side cross-sectional view of an integrated device package 1. The package 1 can include an integrated device die 4 mounted to a carrier 2. The integrated device die 4 can be any type of die, such as a MEMS die, a processor die, etc. In FIG. 1, the carrier 2 comprises a package substrate 3. In a 3D integrated package the carrier 2 can comprise another die, such as an ASIC. The package substrate 3 shown in FIG. 1 comprises a printed circuit board (PCB), the package substrate can be any other type of substrate, such as a ceramic substrate, glass substrate, leadframe, etc. Wire bonds 5 can electrically connect the die 4 to the package substrate 3. To protect the die 4, a package body comprising a molding material 6 (also known as encapsulant) can be applied over the die 4 and substrate 3.

As explained herein, external loading conditions may exert forces, moments, and/or torques against the package 1 and die 4. For example, as shown in FIG. 1, a moment $M_x$ may be applied to the die 4 about the x-axis, a moment $M_y$ may be applied to the die about the y-axis, and a moment $M_z$ may be applied to the die about the z-axis. The applied moments $M_x$, $M_y$, and $M_z$ may induce bending and/or torsional stresses in the die 4. The induced stresses may damage active components that are formed in the die 4, resulting in altered performance and/or failure of the package 1 or die 4. While some alteration in performance can be addressed by post-package calibration, such processes add to expense and furthermore may not address certain types of post-shipment stresses.

For example, during manufacturing, application of the molding material 6 can generate vertical stresses in the negative z-direction and/or in other directions to introduce bending stresses in the die 4. If, for example, particles in the molding material expand or contract due to varying temperature and/or humidity levels, the resulting non-uniform moments can induce bending stresses that can damage the die 4 and the components formed therein. Furthermore, during assembly, stresses and strains can be induced in the die 4 when mounting the die to the carrier 2 and/or when mounting the carrier 2 to the larger electronic system. If adhered components, such as adhesive layers, molding material 6, and the carrier 3, have mismatched CTE relative to the die 4, then temperature differences can generate additional bending or torsional stresses in the die. As explained herein, stresses can be introduced at any point in the life cycle of the die 4, e.g., during manufacturing, assembly, and/or operation of the die 4 and/or package 1. Accordingly, it can be advantageous to reduce the magnitude of the stresses and/or strains induced in the die 4.

Figure 2A:
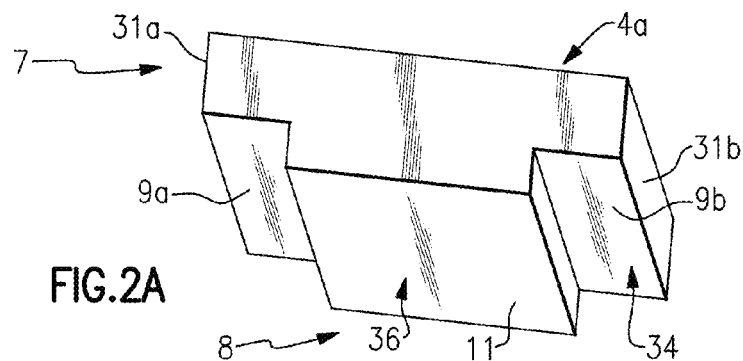
FIG. 2A is a schematic three-dimensional perspective view of an integrated device die, according to one embodiment.
Figure 2B:
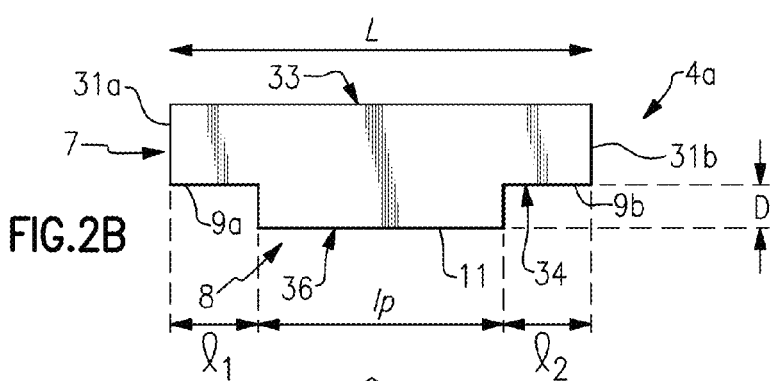
FIG. 2B is a schematic side view of the integrated device die of FIG. 2A.

FIG. 2A is a schematic three-dimensional perspective view of an integrated device die 4a, according to one embodiment. FIG. 2B is a schematic side view of the integrated device die 4a of FIG. 2A. The die 4a illustrated in FIGS. 2A-2B includes stress reducing features that are defined in the body of the die 4a. For example, the die 4a includes an upper portion 7 and a lower portion 8 monolithically formed with the upper portion 7. The die 4a therefore comprises a single, unitary body having monolithically formed upper and lower portions 7, 8. The die 4a shown in FIG. 2A can be formed from a single piece of bulk semiconductor material, e.g., silicon, etc. For example, as explained herein the die 4a can be shaped by various wafer-level processes such as partial sawing through the wafer thickness before singulation.

The die 4a can be shaped to have a T-shaped cross-sectional profile. For example, the upper portion 7 can have a first lateral side 31a and an opposing second lateral side 31b that define at least a portion of a periphery of the upper portion 7. An upper surface 33 of the upper portion 7 can be disposed between upper edges of the first and second opposing lateral sides 31a, 31b. One or more active components can be formed in the upper portion 7. For example, the active components can be formed at or near the upper surface 33 of the upper portion 7. The die 4a can be any suitable type of device die, and the active components can comprise any suitable type of active component. For example, in some embodiments, the die 4a comprises a MEMS device die, such as a MEMS sensor, e.g., a motion sensor, optical sensor, etc. In such embodiments, the active components can comprise micro-electromechanical features patterned in the die 4a. In other embodiments, the die 4a comprises an ASIC, such as a processor die, and integrated circuits can be patterned in the die 4a. Still other types of dies may be formed.

The lower portion 8 can include a pedestal 11 extending downwardly from the upper portion 7. As shown in FIGS. 2A-2B, the lower portion 8 can define a single pedestal. The pedestal 11 can include a distal portion 36 configured to couple to a carrier, e.g., by an adhesive layer. As shown in FIGS. 2A-2B, the pedestal 11 can be laterally inset from lower edges of the first and second opposing lateral sides 31a, 31b. For example, a lower surface 34 of the upper portion 7 can define a first overhang region 9a that extends from the pedestal 11 to the lower edge of the first lateral side 31a of the upper portion 7. The lower surface 34 of the upper portion 7 can define a second overhang region 9b that extends from the pedestal 11 to the lower edge of the second lateral side 31b of the upper portion 7. As shown in FIGS. 2A-2B, the first and second overhang regions 9a, 9b can be disposed on opposing sides of the pedestal 11. The first and second overhang regions 9a, 9b can be monolithically formed with a proximal portion of the pedestal 11. As explained herein, the pedestal 11 can be formed by sawing through a wafer in some arrangements. Accordingly, the lower surface 34 of the upper portion 7, e.g., in the overhang portions 9a, 9b, can have sawn surfaces. Furthermore, the side surfaces of the pedestal 11 between the overhang portions 9a, 9b and the distal portion 36 can also have sawn surfaces defined by sawing. The sawn surfaces can be formed by mechanical sawing, which defines a sawn surface different from that formed by other processes such as laser cutting or etching. For example, sawn surfaces may have surface profiles that indicate the passing of a saw, such as burrs or other irregular profiles.

As shown in FIG. 2B, pedestal 11 can be laterally inset relative to the lower edge of the first lateral side 31a by an inset length $l_1$, which also represents a width of the overhang region 9a. The pedestal 11 can be laterally inset relative to the lower edge of the second lateral side 31b by an inset length $l_2$. In some embodiments, the lateral inset $l_1$ relative to the first side 31a can be about the same as the lateral inset $l_2$ relative to the second side 31a, i.e., the pedestal 11 can be centered with respect to the upper portion 7. In some embodiments, the insets $l_1$ and $l_2$ can be different. The lateral insets $l_1$, $l_2$ can be in a range of about 200 microns to about 800 microns in some embodiments. For example, the lateral insets $l_1$, $l_2$ can be in a range of about 400 microns to about 600 microns. The die 4a can be shaped to have any suitable dimensions, depending upon the application. For example, in an example of a MEMS die, the upper portion 7 of the die 4a is substantially square having sides with a length L of about 2 mm to about 3 mm, e.g., about 2.5 mm in some embodiments. Thus, in some arrangements, if the lateral insets $l_1$, $l_2$ are defined to be about 500 microns each, then a length $l_p$ of the pedestal 11 can be about 1.5 mm. However, depending on the length L of the upper portion 7 of the die and the lateral insets $l_1$, $l_2$, the length $l_p$ of the pedestal 11 can be in a range of about 0.4 mm to about 2.6 mm. For example, in some embodiments, the length $l_p$ of the pedestal can be in a range of about 1 mm to about 2 mm, or more particularly, in a range of about 1.3 mm to about 1.7 mm.

In other arrangements, for dies ranging in size from about 1 mm to 10 mm, the length $l_p$ of the pedestal can be defined in proportion to the length L. For example, the pedestal can have a length $l_p$ that is in a range of about 15% to about 85% of the length L of the upper portion 7. In other arrangements, the pedestal can have a length $l_p$ that is in a range of about 30% to about 80% of the length L of the upper portion 7, or more particularly 45% to 70% of the length L.

In various arrangements, the die 4a can have a thickness T of between about 475 microns and about 525 microns in some arrangements. In other arrangements, the die 4a can have a thickness T of between about 575 microns and about 625 microns (e.g., a MEMS chip). In yet other arrangements, the die 4a can have a thickness T between about 225 microns and about 275 microns (e.g., a voltage reference chip). The pedestal 11, or the wafer-level groove that defines it, can be formed to have a depth D defined between the lower surface 34 of the upper portion 7 and the distal portion 36 of the pedestal 11. For example, in some embodiments, the depth D can be in a range of about 25 microns to about 300 microns, e.g., in a range of about 50 microns to about 250 microns. In some embodiments, the depth D can be in a range of about 75 microns to about 150 microns, e.g., about 100 microns in some embodiments. In some arrangements, the depth D can be defined in proportion to the thickness T of the die 4a. For example, in some arrangements, the depth D can be in a range of about 10% to about 60% of the thickness T of the die 4a. In other arrangements, the depth D can be in a range of about 15% to about 25% of the thickness T of the die 4a, e.g., about 20% of the thickness T.

The generally T-shaped profile of the die 4a shown in FIGS. 2A-2B can reduce stresses and strains induced in the die 4 due to external loading conditions. For example, the T-shaped profile can define a second moment of area that resists bending and/or torsional stresses better than rectangular-shaped profiles. Furthermore, by forming the upper and lower portions 7, 8 in a single, monolithic body, the stresses and strains induced in the die 4a can be reduced as compared to multi-piece arrangements, at least because such multi-piece arrangements may be subject to interface stresses and/or manufacturing challenges. The die 4b can be formed from a single piece of bulk semiconductor material, e.g., silicon, etc. For example, as explained herein the die 4b can be shaped by various wafer-level processes such as sawing. Moreover, the area of the distal portion of the pedestal 11 that attaches to the carrier may be relatively small, which can advantageously reduce stresses transmitted from the carrier to the die (e.g., stresses due to thermal mismatch).

Figure 2C:
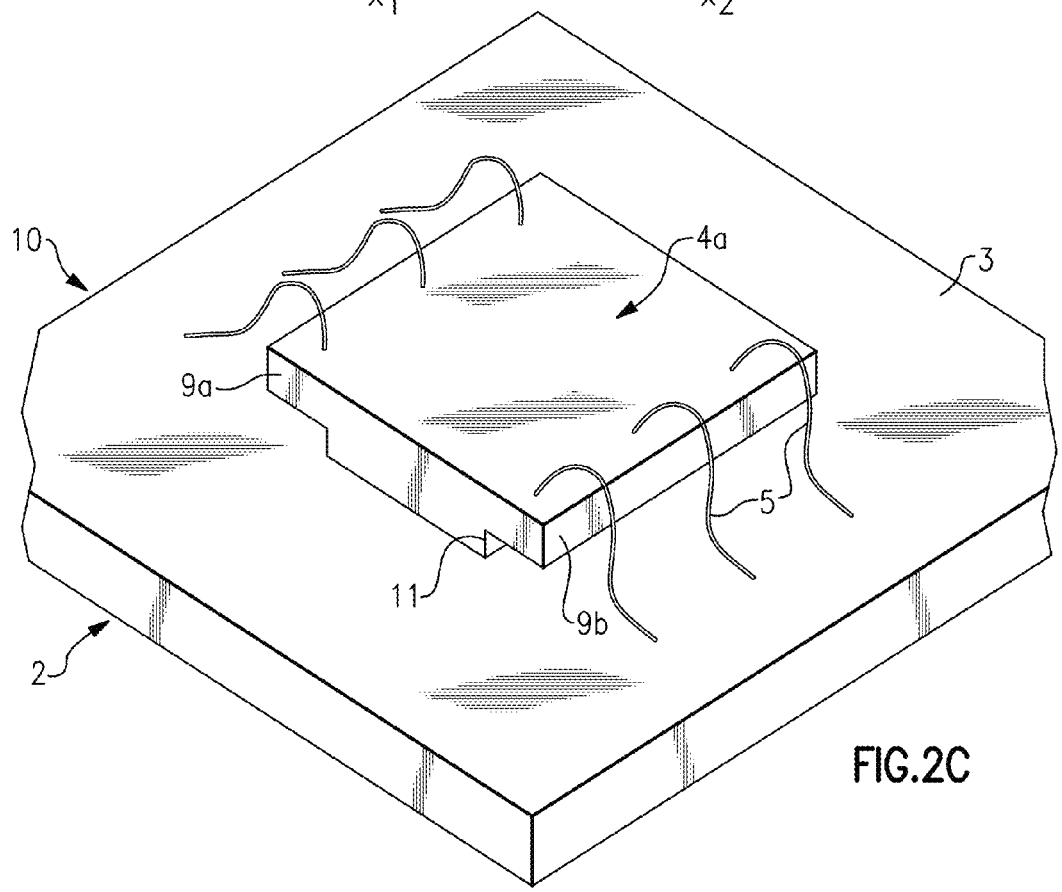
FIG. 2C is a schematic three-dimensional perspective view of a partially-fabricated integrated device package that includes the integrated device die of FIGS. 2A-2B, according to one embodiment.

FIG. 2C is a schematic three-dimensional perspective view of a partially-fabricated integrated device package 10 that includes the integrated device die 4a of FIGS. 2A-2B, according to one embodiment. For ease of illustration, the package body (which may include a molding material and/or a package lid or cap) is not shown. As shown in FIG. 2C, the die 4a can be mounted to a carrier 2. In the embodiment of FIG. 2C, the carrier 2 comprises a package substrate 3. As explained herein, the package substrate 3 can be any suitable substrate, such as a leadframe, PCB, a ceramic substrate, a glass substrate, etc. The package substrate 3 schematically illustrated in FIG. 2C comprises a PCB substrate. In the embodiment of FIG. 2C, the distal portion 36 of the pedestal 11 can be mechanically and/or electrically coupled to the substrate 3. For example, an adhesive can be applied to directly attach the distal portion 36 to the substrate 3. The adhesive can be a suitable epoxy in some arrangements. In other arrangements, solder or any other type of adhesive can be used.

The die 4a can be electrically connected to the package substrate 3 by way of bonding wires 5, e.g., gold bonding wires. In other arrangements, however, the die 4a can be coupled to the package substrate 3 by way of a flip-chip mounting arrangement, in which bonding pads on the die 4a are soldered or otherwise electrically coupled to corresponding landing pads of the package substrate 3. Through-silicon vias (TSVs) may be used in some embodiments to provide electrical communication through the thickness of the die 4a.

For example, TSVs can be formed between the upper surface 33 of the upper portion 7 and the distal portion 36 of the pedestal 11. Bonding pads on the distal portion 36 can electrically connect to the package substrate 3. Thus, in some arrangements, the grooves can be formed in a back side of the die 4a, and the distal portion 36 of the pedestal 11 can electrically connect to the package substrate 3. The relatively small area of the distal portion 36 of the pedestal can reduce stresses that are transmitted to the die 4a from the carrier. In other arrangements, the grooves may be formed in a front side of the die 4a, and active components (or bond pads coupled thereto) can be electrically connected to the package substrate 3.

FIG. 2D is a schematic three-dimensional perspective view of an integrated device die 4b, according to another embodiment. FIGS. 2E and 2F are schematic orthogonal cross-sectional side views of the integrated device die 4b of FIG. 2D. As shown in FIGS. 2E and 2F, the orthogonal side views of the die 4b can be substantially the same in some embodiments. For example, the die 4b can define generally T-shaped profiles in both orthogonal side views (and cross-sections). Defining T-shaped profiles in orthogonal directions can advantageously yield moments of area that resist torsional and/or bending stresses substantially relative to rectangular-shaped profiles.

As with the embodiment of the die 4a shown in FIGS. 2A-2C, the die 4b can include an upper portion 7 and a lower portion 8 monolithically formed with the upper portion 7. The upper portion 7 can include first and second opposing lateral sides 31a, 31b, as well as third and fourth opposing lateral sides 31c, 31d. The lateral sides 31a-d can define at least a portion of a periphery of the upper portion 7 such that an upper surface 33 is disposed between upper edges of the sides 31a-31d. Active components can be formed in the upper portion 7, e.g., at or near the upper surface 33. The die 4b can be any suitable type of device die, e.g., a MEMS die, a processor die, etc.

As with the embodiment of FIGS. 2A-2C, the lower portion 8 can include a pedestal 11 extending downwardly from the upper portion 7. As shown in FIGS. 2D-2F, the lower portion 8 can include a single pedestal. The pedestal 11 can include a distal portion 36 configured to couple to a carrier. The area of the distal portion 36 can be relatively small so as to reduce the transmission of stresses from the carrier to the die 4b. As shown in FIGS. 2D-2F, the pedestal 11 can be laterally inset from lower edges of the first and second opposing lateral sides 31a, 31b. The pedestal 11 can also be laterally inset from lower edges of the third and fourth opposing lateral sides 31c, 31d. For example, a lower surface 34 of the upper portion 7 can define a first overhang region 9a that extends from the pedestal 11 to the lower edge of the first lateral side 31a of the upper portion 7. The lower surface 34 of the upper portion 7 can define a second overhang region 9b that extends from the pedestal 11 to the lower edge of the second lateral side 31b of the upper portion 7. The lower surface 34 can define a third overhang region 9c extending from the pedestal 11 to the lower edge of the third lateral side 31c of the upper portion 7, and the lower surface 34 can also define a fourth overhang region 9d extending from the pedestal 11 to the lower edge of the fourth lateral side 31d of the upper portion 7. As shown in FIGS. 2D-2F, the first and second overhang regions 9a, 9b can be disposed on opposing sides of the pedestal 11, and the third and fourth overhang regions 9c, 9d can be disposed on opposing sides of the pedestal 11. The overhang regions 9a-9d can be monolithically formed with a proximal portion of the pedestal 11. The lower surface 34 of the upper portion 7, e.g., in the overhang portions 9a-9d, can have sawn surfaces. Furthermore, the lateral surfaces between the overhang portions 9a-9d and the distal portion 36 can also have sawn surfaces defined by sawing. The sawn surfaces can be formed by mechanical sawing, which defines a sawn surface different from that formed by other processes such as laser cutting or etching.

As shown in FIGS. 2D-2F, the pedestal 11 can be laterally inset relative to the lower edge of the first lateral side 31a by an inset length $l_1$. The pedestal 11 can be laterally inset relative to the lower edge of the second lateral side 31b by an inset length $l_2$. The pedestal 11 can be laterally inset relative to the lower edge of the third lateral side 31c by an inset length $l_3$. The pedestal 11 can be laterally inset relative to the lower edge of the fourth lateral side 31d by an inset length $l_4$. In some embodiments, the lateral insets $l_1$-$l_4$ can be about the same; in other embodiments, the insets $l_1$-$l_4$ can be different. The lateral insets $l_1$-$l_4$ can generally have the same dimensions and/or percentages as those explained herein with respect to FIGS. 2A-2C, except the lengths are measured along four sides of the pedestal 11.

In various embodiments, the pedestal 11 can be formed to have a depth D defined between the lower surface 34 of the upper portion 7 and the distal portion 36 of the pedestal 11. The depth D can be generally similar to that described above with reference to FIGS. 2A-2C. For example, the depth D can be defined relative to four overhang regions 9a-9d, rather than two overhang regions 9a-9b, as illustrated in FIGS. 2A-2B.

The die 4b can result in reduced bending or torsional stresses generated by external loads. For example, shaping the die 4b along two dimension to form a generally T-shaped profile in orthogonal cross-sections can define second moments of area that reduce stresses and strains along or about multiple axes. Furthermore, the monolithic configuration of the die 4b can assist in reducing stresses and strains at least because the stress reduction features are formed in a single piece.

FIG. 2G is a schematic three-dimensional perspective view of a partially-fabricated integrated device package 10 that includes the integrated device die 4b of FIGS. 2D-2F, according to one embodiment. For ease of illustration, the package body (which may include a molding material and/or a package lid or cap) is not shown. As shown in FIG. 2G, the die 4b can be mounted to a carrier 2. In the embodiment of FIG. 2G, the carrier 2 comprises a package substrate 3. In other arrangements, the carrier 2 can include a heat slug or heat sink coupled to package substrate and/or to the larger system. As explained herein, the package substrate 3 can be any suitable substrate, such as a leadframe, PCB, a ceramic substrate, glass substrate, etc. The package substrate 3 schematically illustrated in FIG. 2C comprises a PCB substrate. In the embodiment of FIG. 2C, the distal portion 36 of the pedestal 11 can be mechanically and/or electrically coupled to the package substrate 3 by way of an adhesive. For example, the distal portion 36 can directly attach to the package substrate 3 such that only the adhesive is between the distal portion 36 and the package substrate 3. The die 4b can be electrically connected to the package substrate 3 by way of bonding wires 5, e.g., gold bonding wires. In other arrangements, however, the die 4b can be coupled to the package substrate 3 by way of a flip-chip mounting arrangement. As above, TSVs may also be used to provide electrical communication through the die 4b.

Figure 3A:
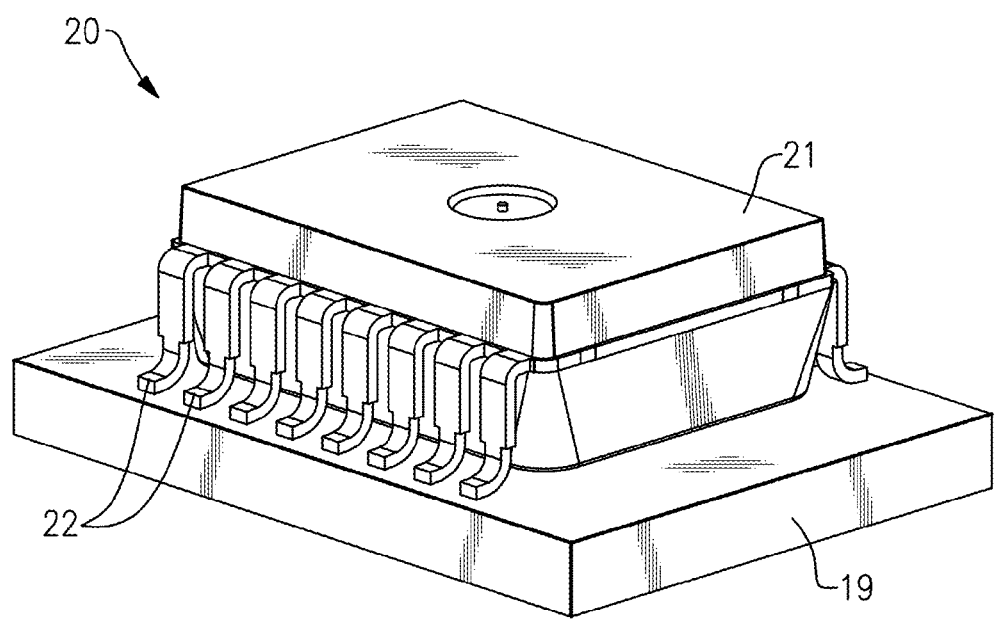
FIG. 3A is a schematic three-dimensional top perspective view of an integrated device package.

FIG. 3A is a schematic three-dimensional top perspective view of an integrated device package 20. The package 20 can comprise a package body 21 and a plurality of leads 22 extending therethrough. For example, the package body 21 can comprise a plastic housing enclosing one or more integrated device dies. In some embodiments, the package body 21 can comprise or be formed by a molding material or encapsulant. The leads 22 can provide electrical communication between the die(s) within the package 20 and an external system board 19. The board 19 can be integrated within a larger electronic system.

Figure 3B:
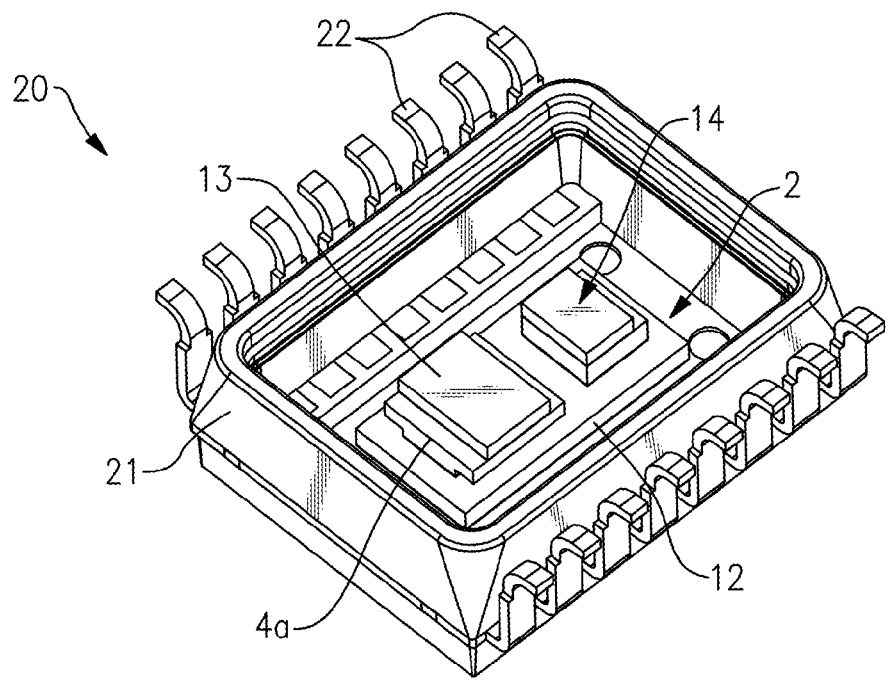
FIG. 3B is a schematic three-dimensional bottom perspective view of the integrated device package of FIG. 3A with a bottom portion of the package body removed for ease of illustration, according to one embodiment.
Figure 3C:
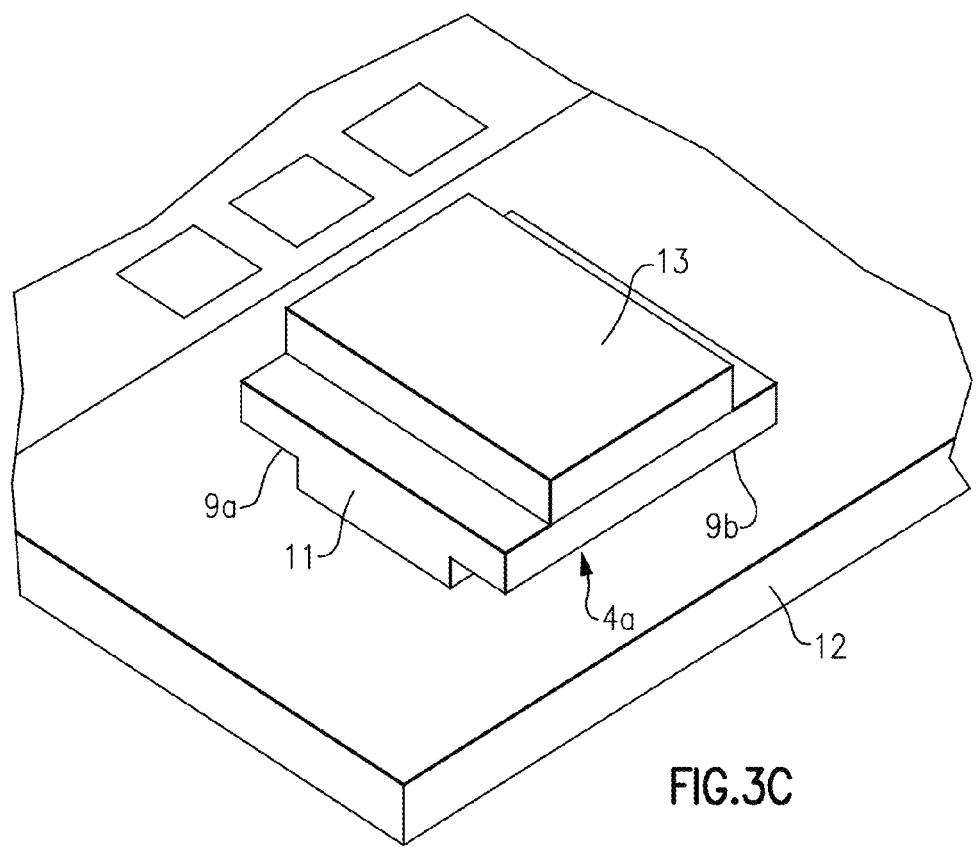
FIG. 3C is a magnified three-dimensional perspective view of the integrated device package of FIG. 3B.

FIG. 3B is a schematic three-dimensional bottom perspective view of the integrated device package 20 of FIG. 3A with a bottom portion of the package body 21 omitted for ease of illustration, according to one embodiment. FIG. 3C is a magnified three-dimensional perspective view of the integrated device package 20 of FIG. 3B. The package 20 of FIGS. 3B-3C includes the integrated device die 4a illustrated in FIGS. 2A-2C. For example, the device die 4a includes first and second overhang regions 9a, 9b, as described above. As with the embodiment of FIG. 2C, the die 4a can couple to a carrier 2. Unlike the package 10 of FIG. 2C, however, in the package 20 of FIGS. 3B-3C, the distal portion 36 of the pedestal 11 couples to a second integrated device die 12. For example, the distal portion 36 can directly attach to the second integrated device die 12 by way of an adhesive. Thus, the carrier 2 of FIGS. 3B-3C comprises another integrated device die such that the die 4a and the second die 12 are coupled together in a stacked configuration.

For example, in FIGS. 3B-3C, the integrated device die 4a can comprise a MEMS die having a cap 13 formed over the die 4a. The cap 13 can comprise a silicon cap over a MEMS moving electrode and cavity in some arrangements. The cap 13 can act to protect the die 4a and its active components from the outside environs. In some embodiments, the die 4a can comprise a MEMS motion sensor die, such as an accelerometer, gyroscope, etc. The second die 12 can comprise a processor die, such as an Application Specific Integrated Circuit. The second die 12 can be configured to process signals detected by the die 4a, including, for example, analog-to-digital conversion. The second die 12 can be coupled to a further carrier, which can be a packaging substrate, such as a mounting portion of a molded leadframe or a portion of the housing 21. In addition, a third integrated device die 14 can be coupled to the second integrated device die 12. The third die 14 can be any suitable type of die, such as a MEMS die, a processor die, a pressure sensor die, etc.

Figure 3D:
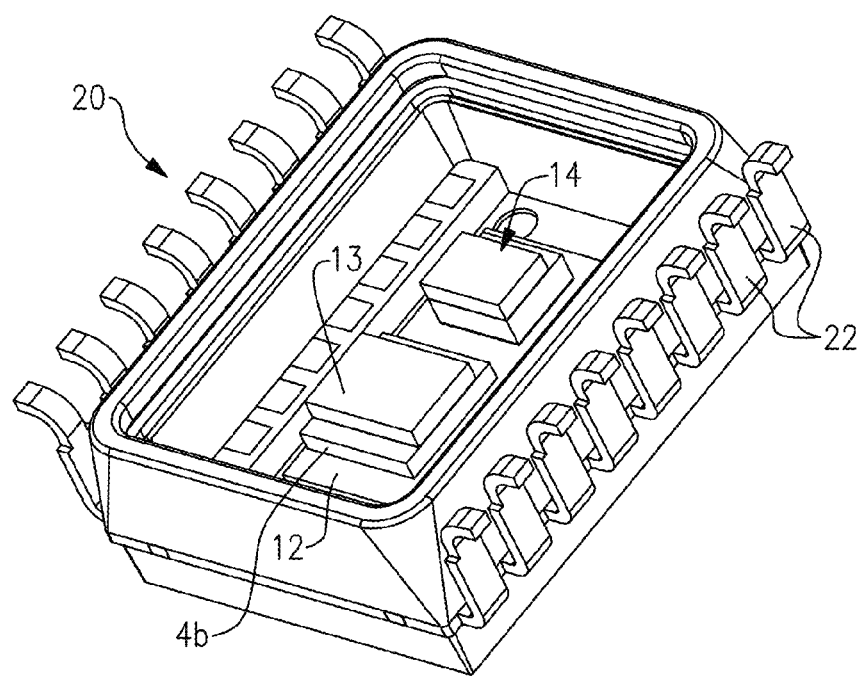
FIG. 3D is a schematic three-dimensional bottom perspective view of the integrated device package of FIG. 3A with a bottom portion of the package body removed for ease of illustration, according to another embodiment.
Figure 3E:
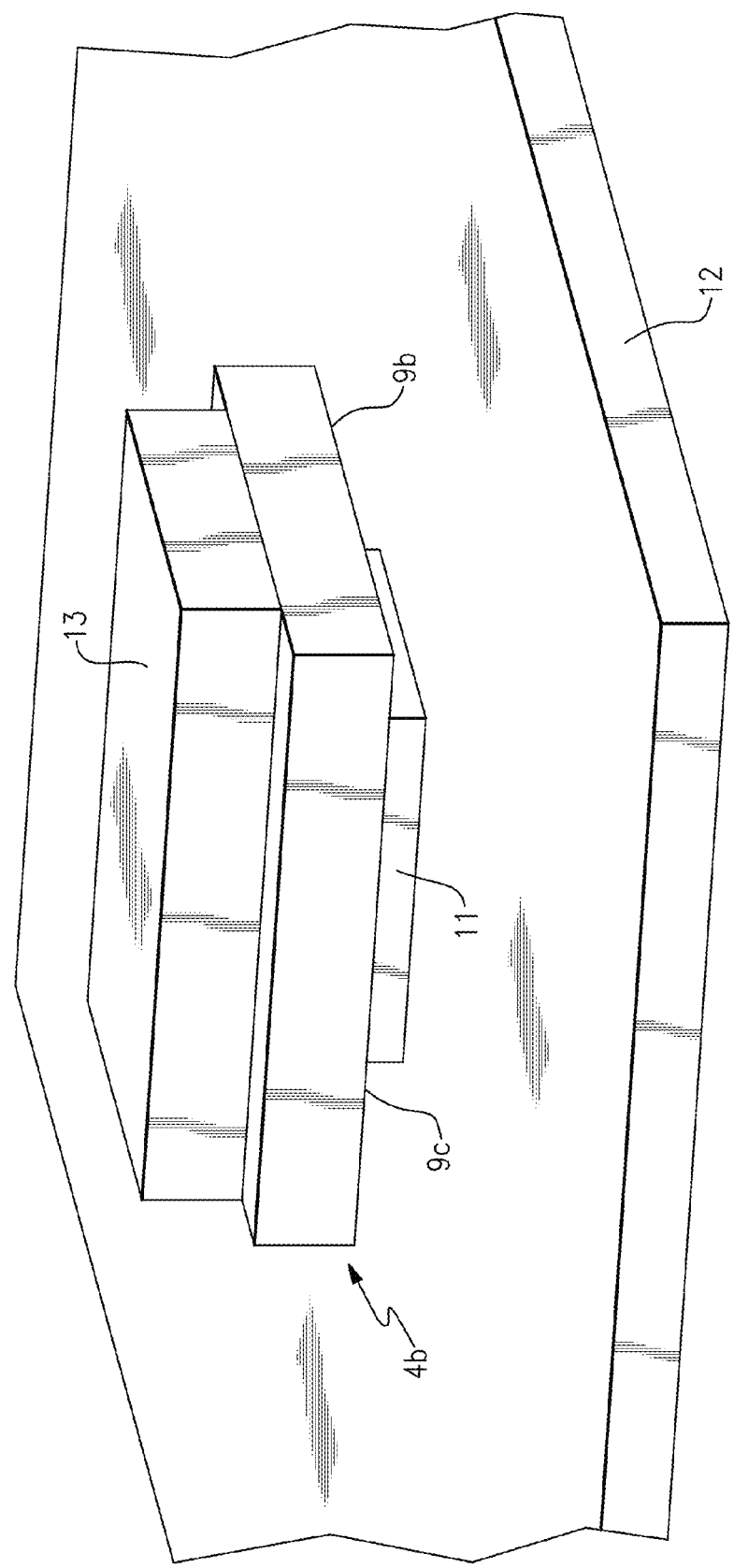
FIG. 3E is a magnified three-dimensional perspective view of the integrated device package of FIG. 3D.

FIG. 3D is a schematic three-dimensional bottom perspective view of a different embodiment of the integrated device package 20 of FIG. 3A with a bottom portion of the package body 21 omitted for ease of illustration, according to another embodiment. FIG. 3E is a magnified three-dimensional perspective view of the integrated device package 20 of FIG. 3D. The package 20 of FIGS. 3D-3E includes the device die 4b illustrated in FIGS. 2D-2G. For example, the device die 4b includes first, second, third, and fourth overhang regions 9a-9d, as described above. As with the embodiment of FIG. 2G, the die 4b can couple to a carrier 2. Unlike the package 10 of FIG. 2G, however, in the package 20 of FIGS. 3D-3E, the distal portion 36 of the pedestal 11 couples to a second integrated device die 12. For example, the distal portion 36 can directly attach to the die 12 by way of an adhesive. Thus, the carrier 2 of FIGS. 3D-3E comprises another integrated device die such that the die 4b and the second die 12 are coupled together in a stacked configuration.

As with the embodiment of FIGS. 3A-3C, the die 4b can comprise a MEMS die and the second die 12 can comprise a processor die, such as an ASIC configured to process signals detected or received by the die 4b. A cap 13 can be applied over active components of the die 4b. Further, the second die 12 can be coupled to a further carrier, which can be a packing substrate, particularly a mounting portion of a molded leadframe or a portion of the housing 21.

Figure 4C:
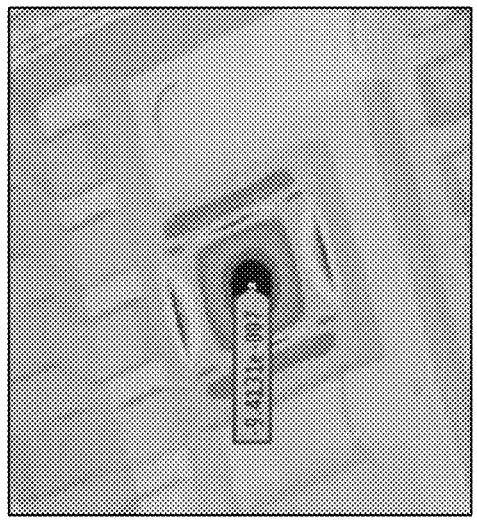
FIGS. 4A-4C are images of simulation results that represent the strain imparted to various integrated device dies subject to the same torque loading condition.
Figure 4B:
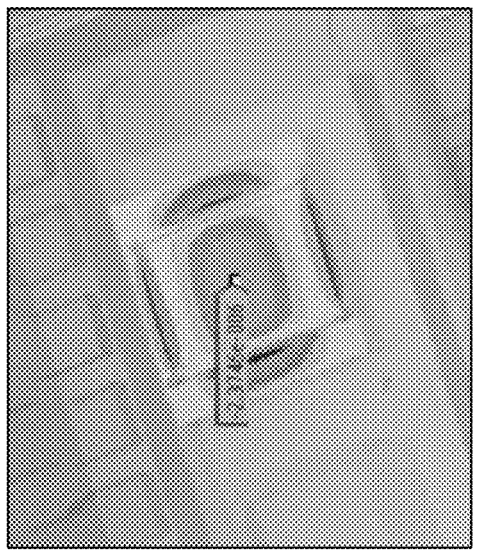
Figure 4A:
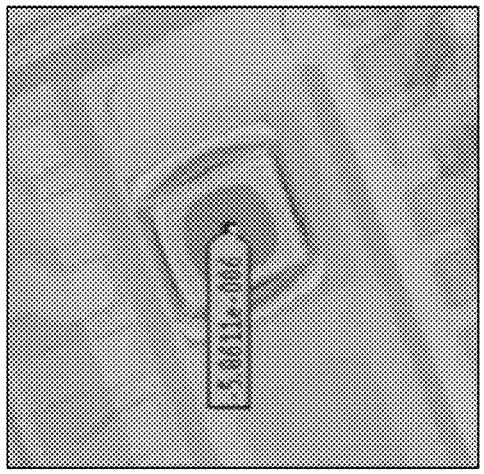

FIGS. 4A-4C are images of simulation results (i.e., finite element analysis simulations) that represent the strain imparted to various integrated device dies subject to the same torque loading condition. In particular, the results shown in FIG. 4A represent the strain field resulting from a torsional loading condition applied to a silicon die similar to that illustrated in FIG. 1, e.g., a die 4 having rectangular side profiles on all four sides. The simulation results presented in FIG. 4B represent the strain field resulting from the same torsional loading condition as applied in FIG. 4A, except the torsional load is applied to a silicon die similar to that illustrated in FIG. 2A, e.g., a die 4a having a generally T-shaped side cross-sectional profile with first and second overhang regions 9a, 9b. The simulation results presented in FIG. 4C represent the strain resulting from the same torsional loading condition as applied in FIGS. 4A-4B, except the torsional load is applied to a silicon die similar to that illustrated in FIG. 2D, e.g., a die 4b having two orthogonal, generally T-shaped side cross-sectional profiles with first, second, third, and fourth overhang regions 9a-d.

In FIGS. 4A-4C, blue colors represent relatively low stresses and strains, and red colors represent relatively high stresses and strains. The maximum strain for each simulation occurs approximately near the center of each die 4, 4a, 4b within or near the upper surface 33 of the upper portion 7. The maximum strain found with respect to the die 4 simulated in FIG. 4A is about 5.9 ppm, the maximum strain for the die 4a simulated in FIG. 4B is about 2.4 ppm, and the maximum strain for the die 4b simulated in FIG. 4C is about 0.94 ppm. Thus, the die 4a illustrated in FIG. 2A yields improved bending and/or torsional characteristics relative to the rectangular profile of the die 4 shown in FIG. 1. By defining a generally T-shaped cross-section, the die 4a may have a second moment of area that resists bending and/or torsional stresses relative to rectangular or block-shaped cross-sections. The die 4b illustrated in FIG. 2D yields improved bending and/or torsional characteristics relative to the die 4a of FIG. 2A. By defining generally T-shaped cross-sections in two orthogonal directions, the die 4b may have a second moment of area that resists bending and/or torsional stresses and strains about multiple axes, which can lead to improved stress-strain characteristics relative to the dies 4 and 4a of FIGS. 1 and 2A, respectively.

Figure 5:
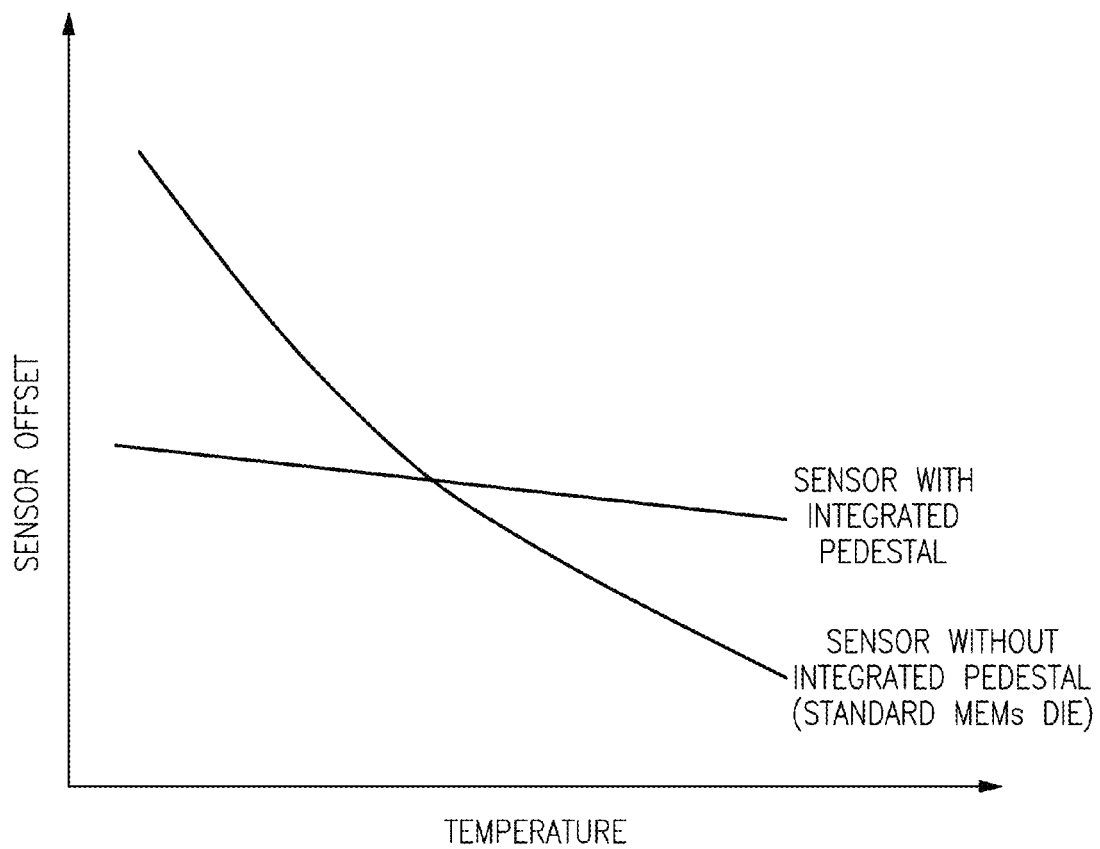
FIG. 5 is a plot of sensor offset output versus temperature for the package shown in FIG. 3D.

FIG. 5 is a plot of sensor offset output versus temperature for the package 20 shown in FIG. 3D. In particular, with respect to the results of FIG. 5, the die 4b of package 20 can comprise a MEMS die including an angular acceleration sensor device. The MEMS die can measure angular acceleration and transmit a detected signal to the second die 12 (e.g., a processor die). The second die 12 can process the detected signal, and the processed signals are shown in the graphs of FIG. 5. When the MEMS die 4b is mounted to a carrier, such as the processor die 12, the resulting attachment of the die 4b to the die 12 can cause thermally-induced stresses in the die 4b.

For MEMS dies that do not include a pedestal 11 (e.g., similar to the arrangement shown in FIG. 1), the sensor offset can vary significantly as a function of temperature. For example, without a pedestal, temperature changes can induce stresses in the die 4b, which can change the sensor offset of the die 4b. As shown in FIG. 5, if the die 4b does not include a pedestal or stud, the sensor output can change significantly and in a non-linear manner, which can damage the die 4b and/or make calibration difficult. By contrast, as shown in FIG. 5, when the die 4b includes an integrated pedestal 11, the sensor offset can be relatively constant or flat over a range of temperatures, and the sensor offset can be relatively linear, which can advantageously make calibration easier than in other packages. Moreover, the relatively flat sensor offset values over a temperature range may indicate that thermally-induced stresses are reduced or eliminated, because the sensor output does not significantly change as the temperature changes.

Advantageously, the output plotted in FIG. 5 for dies with integrated platforms or studs have smaller slopes, and are more linear, than the sensor outputs for dies without integrated platforms or studs. Linear sensor outputs may be advantageous for various reasons. For example, linear outputs over a wide range of temperatures can help with calibration errors. Furthermore, lower slopes in the graphs can be advantageous at least because the sensors are less sensitive to changes in temperature than sensors having output graphs with higher slopes. Accordingly, the dies 4a, 4b disclosed herein can advantageously improve the bending and/or torsional characteristics sufficiently such that device performance is also improved.

Figure 6:
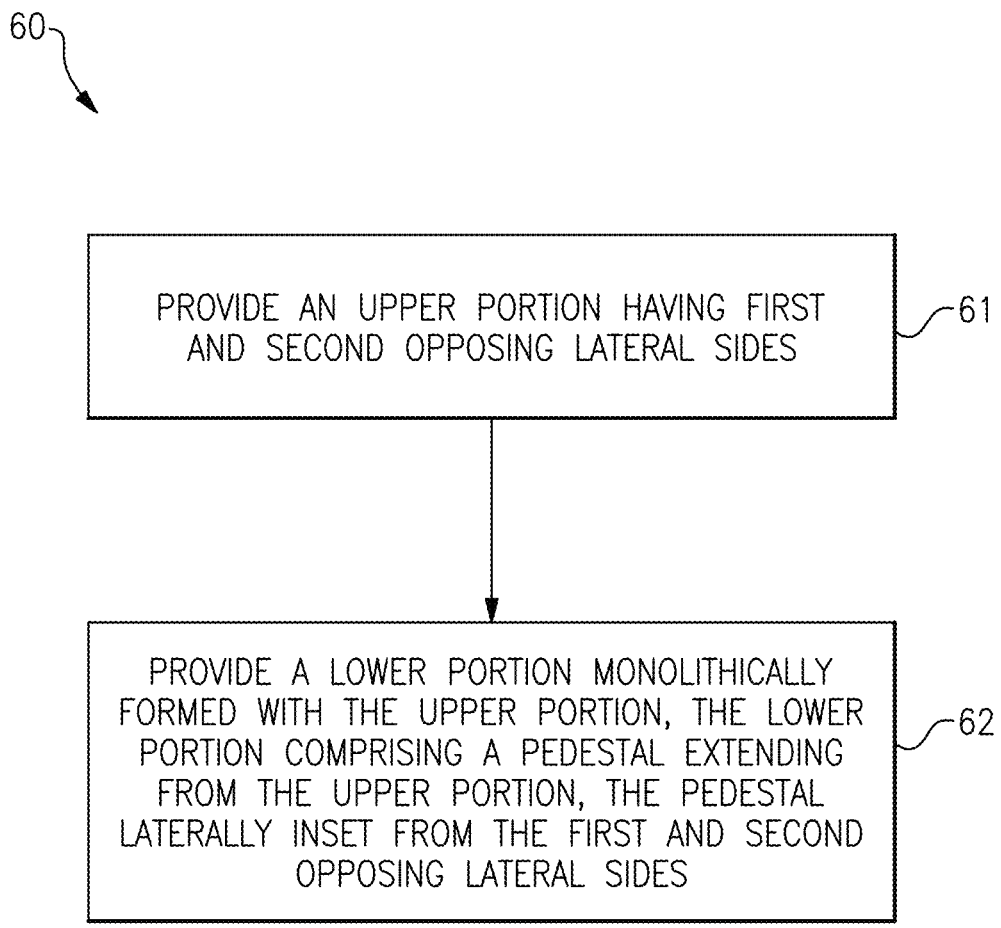
FIG. 6 is a flowchart illustrating a method of forming a microelectronic device, according to one embodiment.

FIG. 6 is a flowchart illustrating a method 60 of forming a microelectronic device, according to one embodiment. As discussed herein, methods of forming microelectronic devices can include forming the device dies, and can additionally include packaging the device dies into a package and/or assembling the packaged device into the larger electronic system. The method 60 begins in a block 61, in which an upper portion of the die having first and second opposing lateral sides is provided. As explained herein, one or more active components can be formed in the upper portion. For example, the die can comprise a MEMS die, a processor die, or any other suitable type of die, and the active components can be formed accordingly. The first and second lateral sides can define at least a portion of a periphery of the upper portion such that an upper surface of the upper portion is disposed between upper edges of the first and second opposing lateral sides.

The method moves to a block 62, in which a lower portion monolithically formed with the upper portion is provided. The lower portion can comprise a pedestal extending from the upper portion. The pedestal can be laterally inset from the first and second opposing lateral sides. In some embodiments, the upper portion can include third and fourth opposing lateral sides defining at least a portion of the periphery of the upper portion. The pedestal can also be laterally inset relative to the third and fourth opposing lateral sides.

The method can further include mounting the die to a carrier, such as a package substrate (e.g., PCB, leadframe, etc.) or another device die. For example, the distal portion of the pedestal can be coupled or adhered to the carrier to mechanically and/or electrically connect the die to the carrier. In embodiments where the carrier is another device die, the dies can be arranged in a stacking configuration. Wire bonds or other techniques (such as flip-chip arrangements) can be employed to electrically connect the die to the carrier. The die can be packaged into a package body. In some arrangements, the package body can comprise a molding material or encapsulant. In other arrangements, the package body can comprise a plastic housing.

The embodiments disclosed herein can monolithically define stress reducing features such as the pedestals described herein in an integrated device die using simplified processing techniques. For example, the techniques disclosed herein can employ sawing at the wafer level to shape the bulk semiconductor material into a desired cross-sectional profile, instead of attaching separate discrete components designed to reduce stresses. Furthermore, by sawing the wafer, expensive and inefficient etching techniques may be avoided in some embodiments.

Figure 7A:
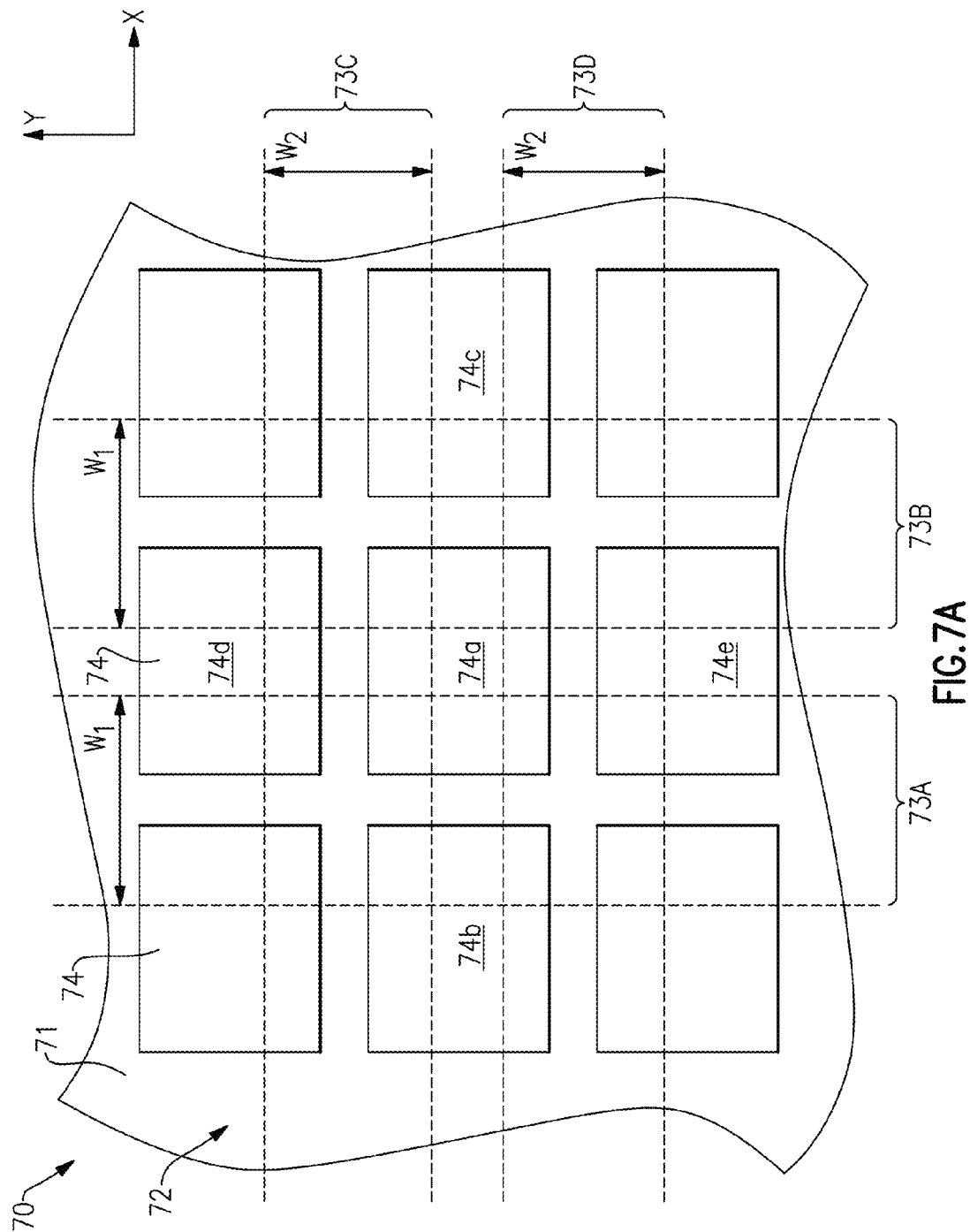
FIGS. 7A and 7B are bottom plan views of a portion of a back side of a wafer having a plurality of device cells.
Figure 7B:
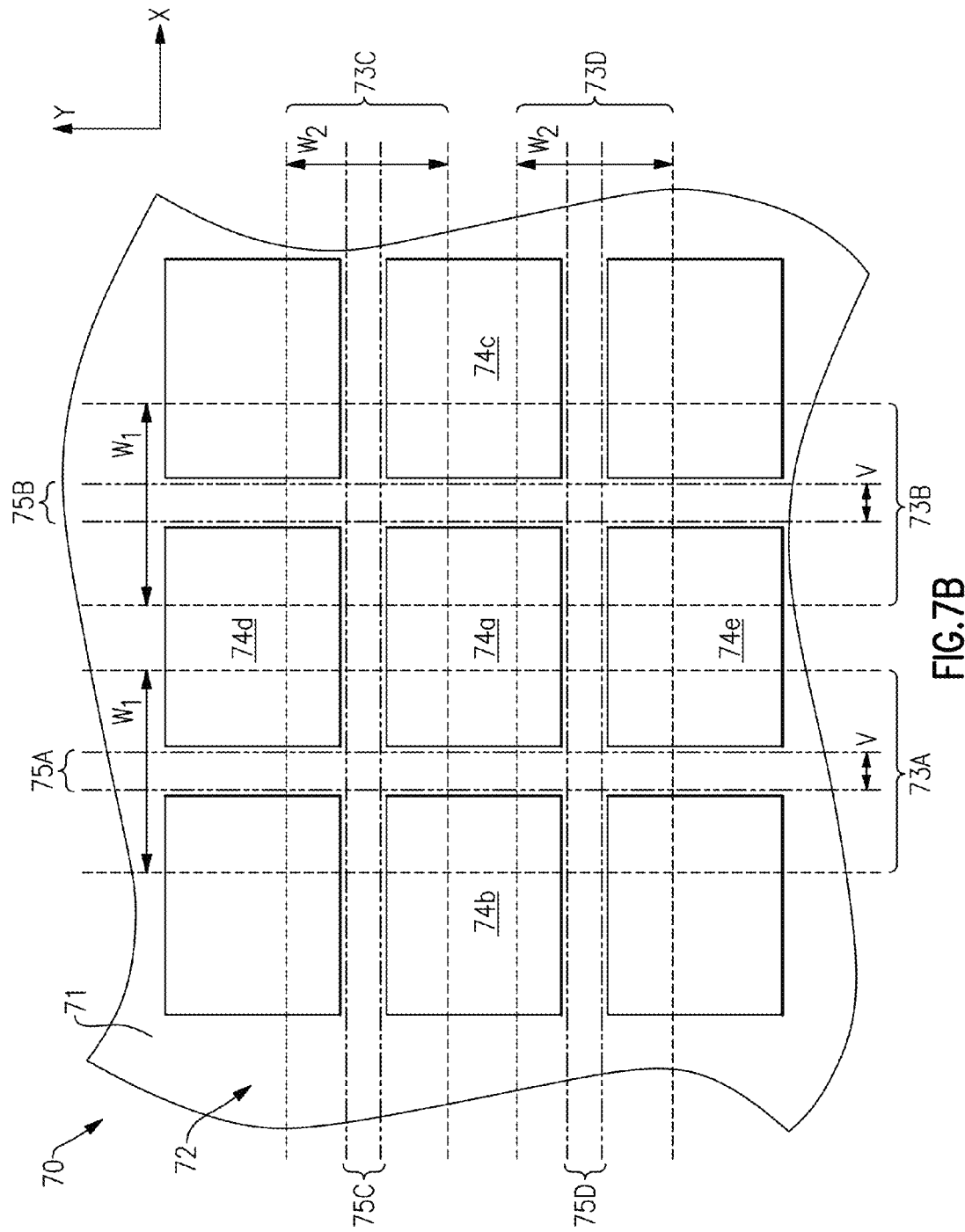
Figure 7C:
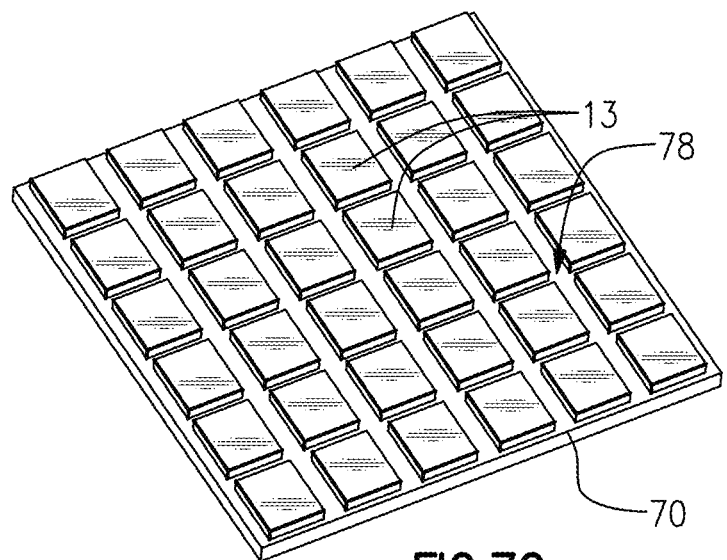
FIGS. 7C-7H illustrate a wafer at various steps of a die manufacturing process.
Figure 7D:
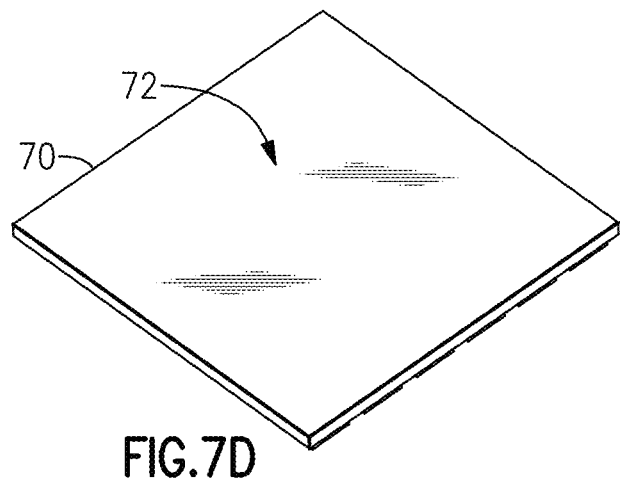

FIGS. 7A and 7B are plan views of a portion of a back side 72 of a wafer 70 having a plurality of device cells 74 defined in a base 71. The device cells 74 are schematically illustrated herein and are meant to represent an approximate area of the wafer 70 that includes active components of each die when diced. For example, as shown in FIG. 7A, the illustrated portion of the wafer 70 can include a first device cell 74a and four adjacent device cells 74b-74e. To form the pedestal described herein, the back side 72 of the wafer 70 can be sawed partially through a thickness of the wafer 70 between and overlapping with adjacent device cells 74. Sawing between and overlapping with adjacent device cells 74 can define a groove or trench in the back side 72 of the wafer 70. FIG. 7C is a top perspective view of a top side 78 of the wafer, and FIG. 7D is a bottom perspective view of the back side 72 of the wafer 70 prior to sawing. As shown in FIG. 7C, a plurality of caps 13 can be attached to the top side 78 over corresponding MEMS devices that are coupled to or formed with the wafer 70.

Figure 7E:
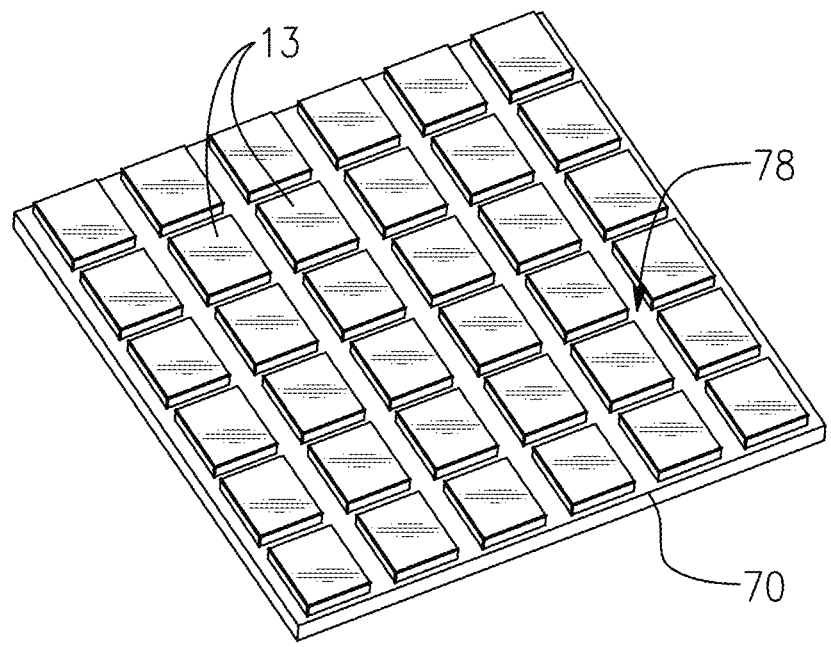
Figure 7F:
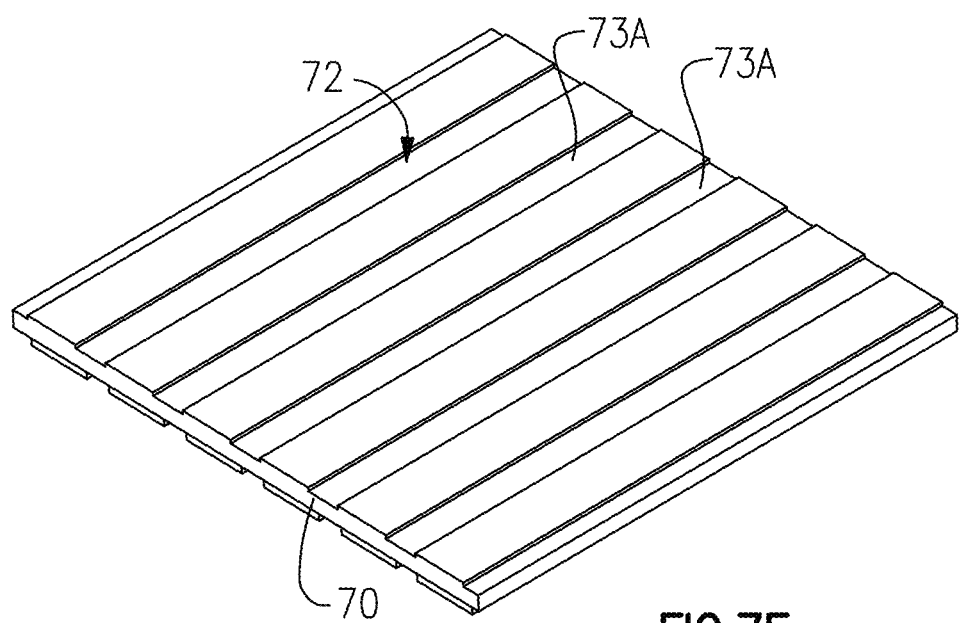

In some embodiments, a first set of saw cuts can be made along a first direction. For example, a first cut can be made along a first saw street 73A in a first direction, e.g., the y-direction, between the first device cell 74a and a second device cell 74b. A second cut can be made along a second saw street 73B in the first direction between the first device cell 74a and a third device cell 74c. The first and second cuts can be made, simultaneously or sequentially, partially through the thickness of the wafer 70 such that the device cells 74 remain mechanically connected. For example, the first and second cuts can be made at a depth in a range of about 50 microns to about 300 microns, e.g., at a depth in a range of about 75 microns to about 150 microns. The first and second cuts can define grooves that ultimately form overhangs in the die 4a shown in FIG. 2A. For example, the first and second cuts can define grooves having a width $W_1$ corresponding to the width of the saw streets 73A, 73B. In some embodiments, the width $W_1$ can be in a range of about 800 microns to about 1200 microns. FIG. 7E is a top perspective view of the top side 78 of the wafer (including caps 13), and FIG. 7F is a bottom perspective view of the back side 72 of the wafer 70 after the first saw cut. Multiple saw cuts are shown in FIG. 7F, including the first and second saw streets 73A, 73B.

Figure 7G:
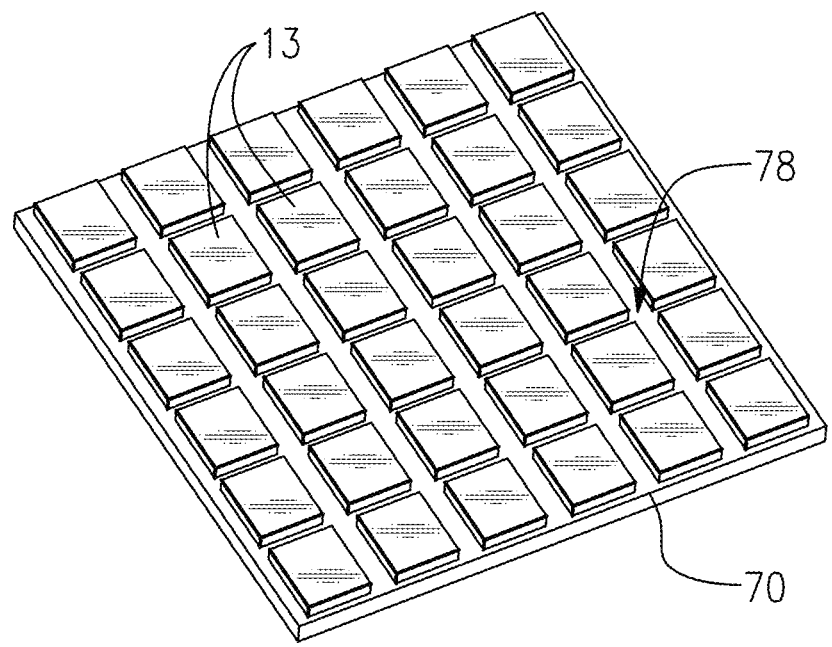
Figure 7H:
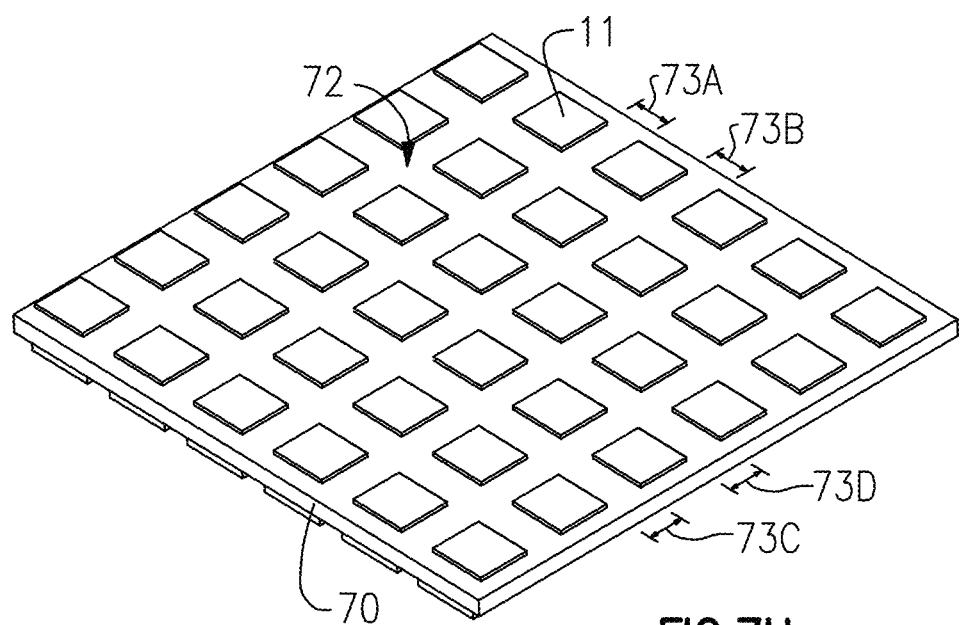

In some embodiments, a second set of saw cuts can be made transverse to the first set of saw cuts. For example, a third cut can be made along a third saw street 73C in a second direction that crosses (e.g., transverse to) the first direction, e.g., the x-direction, between the first device cell 74a and a fourth device cell 74d. A fourth cut can be made along a fourth saw street 73D in the second direction between the first device cell 74a and a fifth device cell 74e. The third and fourth cuts can be made, simultaneously or sequentially, partially through the thickness of the wafer 70 such that the device cells 74 are not separated from one another. For example, the third and fourth cuts can be made at a depth in a range of about 50 microns to about 300 microns, e.g., at a depth in a range of about 75 microns to about 150 microns. The first, second, third, and fourth cuts can define grooves that ultimately form overhangs in the die 4b shown in FIG. 2D. For example, the third and fourth cuts can define grooves having a width $W_2$ corresponding to the width of the saw streets 73C, 73D. In some embodiments, the width $W_2$ can be in a range of about 800 microns to about 1200 microns. FIG. 7G is a top perspective view of the top side 78 of the wafer (including caps 13), and FIG. 7H is a bottom perspective view of the back side 72 of the wafer 70 after the second set of saw cuts made transverse to the first set of saw cuts. Multiple saw cuts are shown in FIG. 7H, including the third and fourth saw streets 73C, 73D.

As explained with respect to FIG. 7A, the pedestals 11 can be defined by sawing partially through the thickness of the wafer 70 between adjacent device cells 74. To form individual integrated device dies 4a or 4b, the wafer 70 can be diced, e.g., the device cells 74 can be singulated, i.e., separated from one another, by sawing or other material removal processes. For example, as shown in FIG. 7B, a first dicing cut can be made along dicing saw street 75A, and a second dicing cut can be made along dicing saw street 75B. A third dicing cut can be made along dicing saw street 75C, and a fourth dicing cut can be made along dicing saw street 75D. The first, second, third, and fourth dicing cuts can be made through the entire remaining thickness of the wafer 70 to separate the wafer 70 into multiple, individual device dies 4a or 4b.

In the illustrated embodiment, the dicing saw streets 75A-75D are narrower than the grooves formed by the saw streets 73A-73D. By dicing along narrower saw streets 75A-75D, the overhang regions 9a-9b can be defined in the device die 4a, and the overhang regions 9a-9d can be defined in the device die 4b. For example, as shown in FIG. 7B, the dicing can be performed by sawing along saw streets 75A-75D in the wafer 70 within the grooves formed by the wider saw streets 73A-73D. Accordingly, multiple integrated device dies 4a or 4b can be efficiently formed using the techniques disclosed herein.

It should be appreciated that the method 60 of FIG. 6 and the techniques discussed herein (e.g., FIGS. 7A-7B) describe only a few example methods and are not meant to limit the order in which various steps are performed. Indeed, skilled artisans will appreciate that the order of the steps discussed herein can be performed in any suitable order. Furthermore, other methods may be used to form a die comprising a monolithic or unitary body with a pedestal to mount to a carrier. For example, in some embodiments, a plasma-based etching configuration can be used to create the grooves in the back side of the wafer that define the pedestal 11. One example of such a plasma-based groove-definition system is the MicroDieSingulator™ sold by Plasma-Therm of Saint Petersburg, Fla.

Figure 8F:
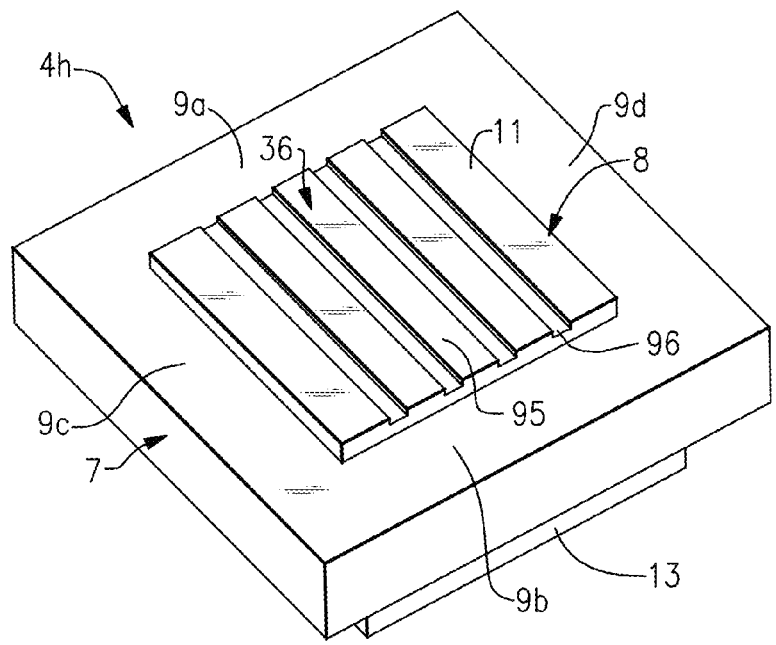
Figure 8G:
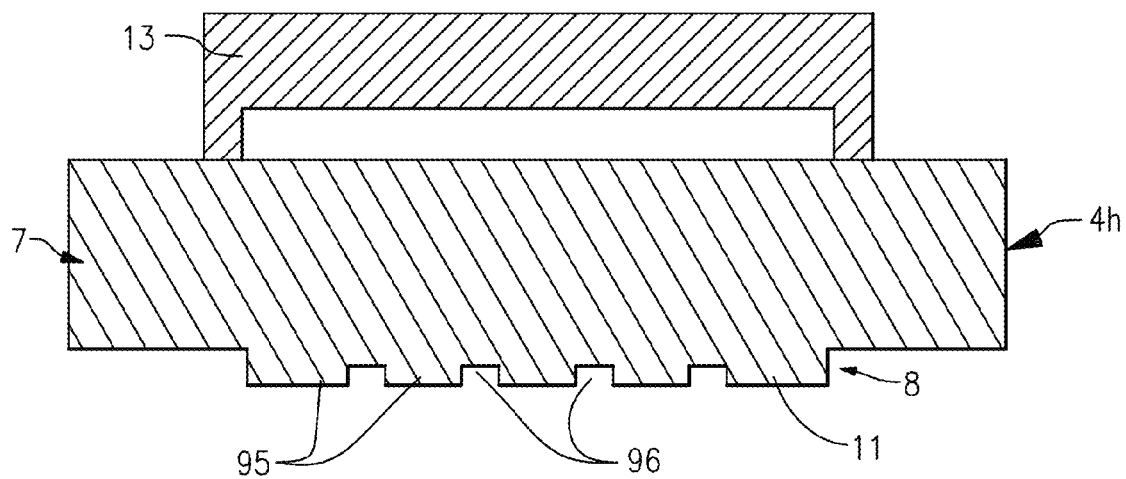
FIG. 8G is a side cross-sectional view of the device die shown in FIG. 8F.

FIGS. 8A-8F are bottom perspective views of device dies 4c-4h that have pedestals 11 with different side profiles. FIG. 8G is a side cross-sectional view of the device die 4h shown in FIG. 8F. As with the embodiments described above, each of the dies 4a-4h shown in FIGS. 8A-8G can advantageously reduce the stresses transmitted to the active components of the dies. For example, the die 4c shown in FIG. 8A can include an upper portion 7 and a lower portion 8. The upper portion 7 can have various active components mounted or coupled thereto. For example, the die 4c can comprise a microelectromechanical systems (MEMS) die having a cap 13 over the MEMS device. The cap 13 can comprise a silicon cap over a MEMS moving electrode and cavity in some arrangements. The cap 13 can act to protect the die 4c and its active components from the outside environs. In some embodiments, the die 4c can comprise a MEMS motion sensor die, such as an accelerometer, gyroscope, etc. The lower portion 8 of the die 4c can comprise a pedestal 11 that can protect the die 4c from stresses induced by the carrier or other components. In addition, the die 4c can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4c can include third and fourth overhang regions 9c, 9d on opposing sides of the pedestal 11, which can be monolithically formed with the proximal portion of the pedestal 11. The pedestal can comprise a distal portion 36 configured to attach to the carrier. In the embodiment of FIG. 8A, the pedestal 11 can comprise an annular profile defined about a central opening 91, when viewed from the bottom. As shown in FIG. 8A, for example, the annular profile can comprise a square frame structure. The profile of the pedestal 11 shown in FIG. 8A can be formed in any suitable way, such as using a plasma-based groove definition process, described above.

In the embodiment of FIG. 8B, the die 4d (which can be a MEMS die) can include an upper portion 7 with a cap 13 and a lower portion 8 comprising a pedestal 11 that has a distal portion 36 configured to attach to a carrier. The pedestal 11 of FIG. 8B can comprise an annular profile with a central opening 91 similar to the die 4c shown in FIG. 8A, however, in the embodiment of FIG. 8B, the square frame can be rotated relative to the upper portion 7 of the die 4d such that corners of the square frame are near the edges of the upper portion 7. In addition, the die 4d can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4d can include third and fourth overhang regions 9c, 9d on opposing sides of the pedestal 11, which can be monolithically formed with the proximal portion of the pedestal 11. As with the embodiment of FIG. 8B, the pedestal 11 of FIG. 8B can be formed in any suitable way, such as using a plasma-based groove definition process.

The die 4e (which can be a MEMS die) shown in FIG. 8C can also include an upper portion 7 with a cap 13 and a lower portion 8 comprising a pedestal 11 that has a distal portion 36 configured to attach to a carrier. Unlike the other embodiments disclosed herein, however, the shape of the pedestal 11 can be rounded, e.g., circular or elliptical, when viewed from the bottom. In addition, the die 4e can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4e can include third and fourth overhang regions 9c, 9d on opposing sides of the pedestal 11, which can be monolithically formed with the proximal portion of the pedestal 11. The rounded pedestal 11 shown in FIG. 8C can be formed in any suitable way, such as using a plasma-based groove definition process.

Similarly, the die 4f (which can be a MEMS die) shown in FIG. 8D can include an upper portion 7 with a cap 13 and a lower portion 8 comprising a pedestal 11 that has a distal portion 36 configured to attach to a carrier. The pedestal 11 shown in FIG. 8D can have a cross-shaped profile when viewed from the bottom of the die 4f. For example, as viewed from the bottom of the die 4f, the pedestal 11 shown in FIG. 8D may not extend from the corner portions 92 of the upper portion 7 of the die 4f. In addition, the die 4f can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4f can include third and fourth overhang regions 9c, 9d on opposing sides of the pedestal 11, which can be monolithically formed with the proximal portion of the pedestal 11. The pedestal 11 shown in FIG. 8D can be formed in any suitable way, such as using a plasma-based groove definition process.

With reference to FIG. 8E, the die 4g (which can be a MEMS die) can include an upper portion 7 with a cap 13 and a lower portion 8 comprising a pedestal 11 that has a distal portion 36 configured to attach to a carrier. The pedestal 11 shown in FIG. 8E can comprise two studs 94 separated by a recess 93. The distal portion 36 can be defined on the distal ends of the studs 94 and can attach to the carrier. In addition, the die 4g can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4g can include third and fourth overhang regions 9c, 9d on opposing sides of the pedestal 11, which can be monolithically formed with the proximal portion of the pedestal 11. The pedestal 11 shown in FIG. 8E can be formed in any suitable way, such as using a partial sawing process or a plasma-based process as disclosed herein.

With reference to FIGS. 8F-8G, the die 4h (which can be a MEMS die) can include an upper portion 7 with a cap 13 and a lower portion 8 comprising a pedestal 11 that has a distal portion 36 configured to attach to a carrier. As shown in the embodiment of FIGS. 8F-8G, however, the pedestal 11 can comprise a plurality of ridges 95 separated by grooves 96. The distal portion 36 can comprise the distal end of each ridge 95 and can be attached to the carrier. In addition, the die 4h can include first and second overhang regions 9a and 9b that are monolithically formed with a proximal end portion of the pedestal 11. The first overhang region 9a and the second overhang region 9b can be disposed on opposing sides of the pedestal 11 such that the pedestal 11 is laterally inset from lateral edges of each of the first and second overhang regions 9a, 9b. Moreover, the die 4h can include third and fourth overhang regions 9c, 9d on opposing sides of the pedestal 11, which can be monolithically formed with the proximal portion of the pedestal 11. The pedestal 11 shown in FIGS. 8F-8G can be formed in any suitable way, such as using a partial sawing process or a plasma-based process as disclosed herein.

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, medical devices, a mobile phone, a telephone, a tablet computing device, a television, a computer monitor, a computer, a handheld computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
a carrier; and
an integrated device die mounted to the carrier, the integrated device die comprising a unitary body comprising a pedestal and first and second overhang regions, the first and second overhang regions monolithically formed with a proximal end portion of the pedestal, the first overhang region and the second overhang region disposed on opposing sides of the pedestal such that the pedestal is laterally inset from lateral edges of each of the first and second overhang regions,
wherein the pedestal comprises a distal portion attached to the carrier.

2. The integrated device package of claim 1, wherein the distal portion of the pedestal is directly attached to the carrier using an adhesive.

3. The integrated device package of claim 1, wherein the unitary body further comprises third and fourth overhang regions monolithically formed with the proximal end portion of the pedestal, the third and fourth overhang regions extending between the first and second overhang regions, the third and fourth overhang regions disposed on opposing sides of the pedestal such that the pedestal is laterally inset from lateral edges of each of the third and fourth overhang regions.

4. The integrated device package of claim 1, wherein the carrier comprises a package substrate configured to attach to a system board.

5. The integrated device package of claim 1, further comprising a package substrate, wherein the carrier comprises a second integrated device die mounted to the package substrate.

6. The integrated device package of claim 5, wherein the integrated device die comprises a microelectromechanical systems (MEMS) die, and wherein the second integrated device die comprises an application specific integrated circuit.

7. The integrated device package of claim 1, further comprising an encapsulant applied over the integrated device die and at least a portion of the carrier.

8. The integrated device package of claim 1, wherein the pedestal includes a recess, groove, or opening formed therein.

9. A microelectromechanical systems (MEMS) device die comprising:
a unitary body comprising:
an upper portion comprising one or more MEMS devices, the upper portion having first and second opposing lateral sides defining at least a portion of a periphery of the upper portion such that the upper portion has a length between upper edges of the first and second opposing lateral sides; and a lower portion monolithically formed with the upper portion, the lower portion comprising a pedestal extending downwardly from the upper portion, the pedestal laterally inset from lower edges of the first and second opposing lateral sides, the pedestal including a distal end portion configured to attach to a carrier.

10. The device die of claim 9, wherein the upper portion further comprises third and fourth opposing lateral sides defining at least a portion of the periphery of the upper portion, wherein the third and fourth lateral sides extend between the first and second lateral sides, and wherein the pedestal is laterally inset from the third and fourth opposing lateral sides of the upper portion.

11. The device die of claim 9, wherein the pedestal has a length that is in a range of about 15% to about 85% of the length of the upper portion.

12. The device die of claim 9, wherein the length of the pedestal is in a range of about 50% to about 70% of the length of the upper portion.

13. The device die of claim 9, wherein the pedestal has a depth defined between the distal end portion and a lower surface of the upper portion that is between about 10% to about 60% of a thickness of the integrated device die.

14. The device die of claim 9, wherein a first side cross-section of the integrated device die comprises a generally T-shaped profile.

15. The device die of claim 14, wherein a second side cross-section of the integrated device die that is orthogonal to the first side cross-section comprises a generally T-shaped profile.

16. The integrated device package of claim 1, wherein the first and second overhang regions are defined at least in part by sawing.

17. The integrated device package of claim 16, wherein the sawing is conducted on a wafer through a partial thickness of the wafer prior to dicing the integrated device die from the wafer.

18. The integrated device package of claim 3, wherein the first, second, third and fourth overhang regions are formed by a first plurality of saw cuts along a first direction and a second plurality of saw cuts along a second direction that crosses the first direction.

19. The device die of claim 9, wherein the pedestal is defined at least in part by sawing through a partial thickness of a wafer prior to dicing.

20. The device die of claim 19, wherein the pedestal is defined at least in part by a first plurality of saw cuts along a first direction and a second plurality of saw cuts along a second direction that crosses the first direction.

* * * * *